US008916804B2

(12) United States Patent
Shigetomi

(10) Patent No.: US 8,916,804 B2
(45) Date of Patent: Dec. 23, 2014

(54) HEAT TREATMENT METHOD, RECORDING MEDIUM HAVING RECORDED PROGRAM FOR EXECUTING HEAT TREATMENT METHOD, AND HEAT TREATMENT APPARATUS

(75) Inventor: Kenichi Shigetomi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 764 days.

(21) Appl. No.: 13/192,018

(22) Filed: Jul. 27, 2011

(65) Prior Publication Data

US 2012/0031894 A1 Feb. 9, 2012

(30) Foreign Application Priority Data

Aug. 9, 2010 (JP) ................................. 2010-178855

(51) Int. Cl.
*H05B 1/02* (2006.01)
*H01L 21/67* (2006.01)
*H01L 21/687* (2006.01)

(52) U.S. Cl.
CPC .... *H01L 21/67103* (2013.01); *H01L 21/67109* (2013.01); *H01L 21/67248* (2013.01); *H01L 21/67253* (2013.01); *H01L 21/68742* (2013.01); *H01L 21/68764* (2013.01)
USPC ...... 219/494; 219/497; 118/725; 156/345.52; 438/660; 392/418

(58) Field of Classification Search
CPC ................... H01L 21/67103; H01L 21/67248; H01L 21/67253; H01L 21/68764; H01L 21/68771; H05B 1/02; H05B 1/0233
USPC ................. 219/494, 497, 507–510, 483–486; 392/416–418; 118/725; 438/5, 54, 660, 438/663; 156/345.52
See application file for complete search history.

(56) References Cited

U.S. PATENT DOCUMENTS

| 6,686,571 | B2* | 2/2004 | Ookura et al. | 219/494 |
| 7,060,939 | B2* | 6/2006 | Shinya et al. | 219/390 |
| 7,910,863 | B2* | 3/2011 | Jyousaka et al. | 219/482 |
| 7,947,926 | B2* | 5/2011 | Fujii et al. | 219/390 |
| 8,014,895 | B2* | 9/2011 | Iwanaga et al. | 700/210 |
| 8,378,272 | B2* | 2/2013 | Shigetomi et al. | 219/494 |
| 8,519,309 | B2* | 8/2013 | Iwata et al. | 219/444.1 |
| 2002/0047004 | A1* | 4/2002 | Johnsgard et al. | 219/390 |
| 2004/0226936 | A1* | 11/2004 | Oyama et al. | 219/444.1 |
| 2004/0250762 | A1* | 12/2004 | Shigetomi et al. | 118/684 |
| 2005/0148104 | A1* | 7/2005 | Kota et al. | 438/14 |
| 2011/0210116 | A1* | 9/2011 | Shigetomi et al. | 219/494 |
| 2012/0031892 | A1* | 2/2012 | Shigetomi et al. | 219/444.1 |

FOREIGN PATENT DOCUMENTS

JP 2003-51439 A 2/2003

* cited by examiner

*Primary Examiner* — Mark Paschall
(74) *Attorney, Agent, or Firm* — Abelman, Frayne & Schwab

(57) ABSTRACT

Provided is a thermal processing method including a first process comprising changing a set temperature of the heating plate from a first temperature to a second temperature; initiating a thermal processing for a first substrate before the temperature of the heating plate reaches the second temperature; obtaining temperature data of the heating plate after the thermal processing is initiated; changing the set temperature of the heating plate from the second temperature when the set temperature reaches the second temperature; and thermal processing of the first substrate using the heating plate for which the set temperature has been changed. The method further includes a second process comprising reinstating the temperature of the heating plate to the second temperature after the thermal processing of the first substrate; and thermal processing of a next substrate using the heating plate while the temperature of the heating plate is maintained at the second temperature.

13 Claims, 14 Drawing Sheets

HEAT TREATMENT METHOD, RECORDING MEDIUM HAVING RECORDED PROGRAM FOR EXECUTING HEAT TREATMENT METHOD, AND HEAT TREATMENT APPARATUS

CROSS-REFERENCE TO RELATED APPLICATIONS

This application is based on and claims priority from Japanese Patent Application No. 2010-178855, filed on Aug. 9, 2010, with the Japanese Patent Office, the disclosure of which is incorporated herein in its entirety by reference.

TECHNICAL FIELD

The present disclosure relates to a method for a heat treatment (e.g., a thermal processing) of a substrate, a computer-readable recording medium storing program for executing the method, and an apparatus for the thermal processing.

BACKGROUND

In a manufacturing process of a semiconductor integrated circuit, a coating and developing processing employing a photolithography technique has been performed to form a resist pattern on the surface of a semiconductor wafer or an LCD substrate (hereinafter, referred to as a "wafer"). The coating and developing processing employing the photolithography technique includes a resist coating process of applying a resist liquid onto the surface of the wafer, an exposure process of exposing a circuit pattern to be transferred on the formed resist film, and a developing process of supplying a developing liquid to the wafer after the exposing process.

Further, various types of thermal processing are performed in the coating and developing processing employing a photolithography technique.

For example, a thermal processing (a pre-baking process) that evaporates residual solvent in the resist film to improve adhesion of the wafer and the resist film is performed between the resist coating process and the exposing process. Further, a thermal processing (a baking after exposure process (PEB; Post Exposure Bake)) that induces an acid catalyzed reaction in chemically amplified resist (CAR) is performed between the exposing process and the developing process. Still further, a thermal processing (a post-baking process) is performed after the developing process to remove the residual solvent in the resist film or a rinse liquid flowed into the resist during the developing processing for preventing the infiltration of the residual solvent and rinse liquid during wet etching.

The condition of the respective thermal processing described above may be strictly regulated to manage the Critical Dimension CD of the resist pattern to be formed. In particular, in a case where the chemically amplified resist (CAR) that has received a wide attention recently due to its capability of accomplishing a high sensitivity, a high resolution and a high resistance over the dry etching is used as a resist, the condition of the thermal processing of the bake after exposure process may be strictly regulated because the difference in the amount of heat being supplied to the resist film at the respective sites within a surface of the substrate has a severe effect on dimension precision of the circuit pattern in the integrated circuits of semiconductor devices to be manufactured.

Japanese Patent Laid-Open Publication No. 2003-51439 discloses a thermal processing method and a thermal processing apparatus in which, in order to manage the condition of the thermal processing, the output amount of heat source is controlled to make the amount of heat being supplied to the substrate during the thermal processing to be the same at a plurality of sites on the substrate.

SUMMARY

An exemplary embodiment of the present disclosure provides a thermal processing method in which each of a plurality of substrates of a substrate group is sequentially disposed and processed on a heating plate set to a predetermined temperature. The method comprises a first process including changing a set temperature of the heating plate from a first temperature to a second temperature; initiating a thermal processing for a first substrate of the substrate group before the temperature of the heating plate reaches the second temperature; obtaining temperature data of the heating plate after the thermal processing is initiated; changing the set temperature of the heating plate from the second temperature when the set temperature reaches the second temperature based on the obtained temperature data of the heating plate; and thermal processing of the first substrate using the heating plate for which the set temperature has been changed. The method further comprises a second process including reinstating the temperature of the heating plate to the second temperature after the thermal processing of the first substrate; and thermal processing of a next substrate of the substrate group using the heating plate while the temperature of the heating plate is maintained at the second temperature.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
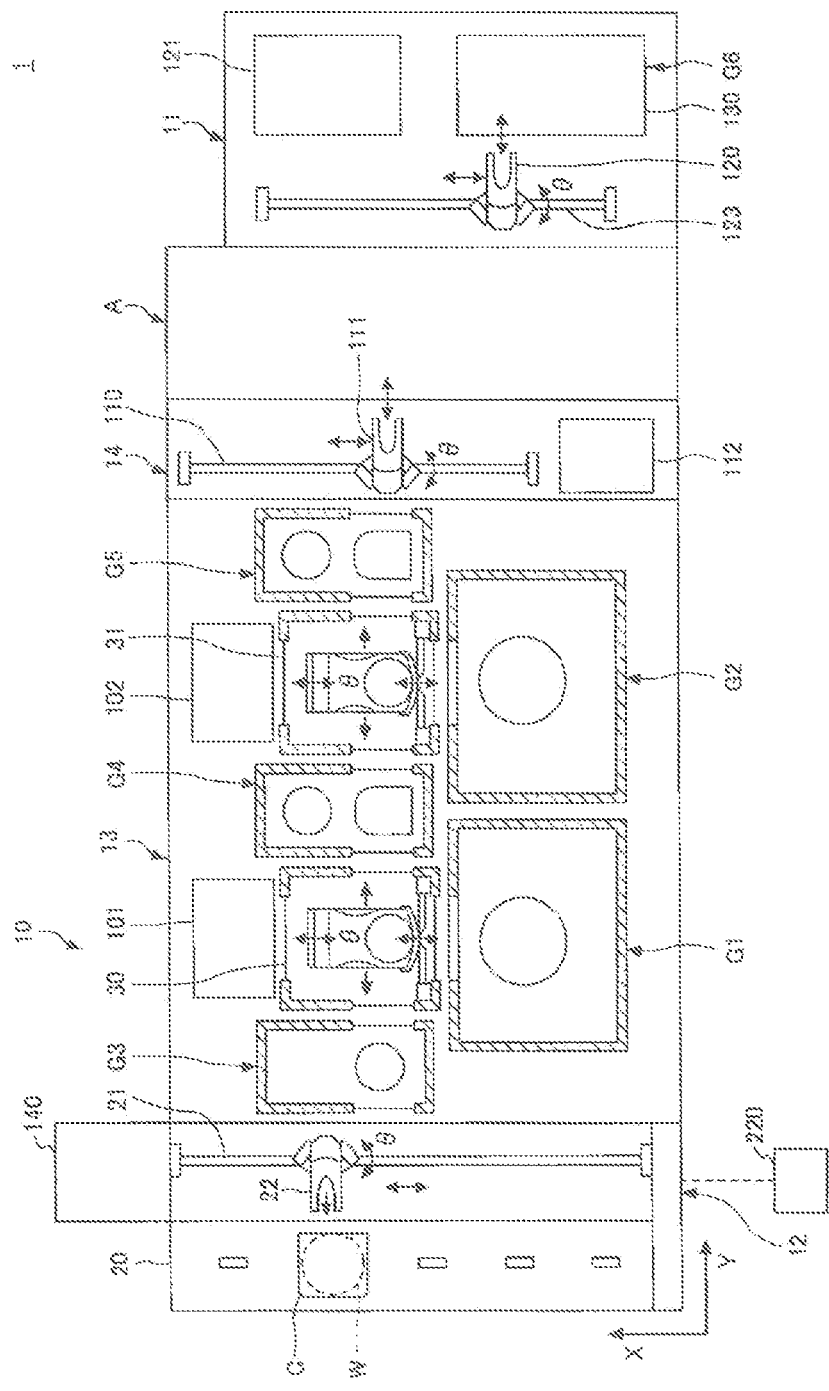
FIG. 1 is a plan view of illustrating a schematic configuration of a coating and developing processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Following problems generally exist in the above-described thermal processing method and thermal processing apparatus.

For example, when a substrate to which a plurality of different types of resist film each requiring a different thermal processing temperature are applied is subjected to a continuous and sequential thermal processing in a post-exposure baking process, the temperature of the heating plate needs to be changed rapidly.

A thermal processing apparatus typically includes a heating plate and a substrate is disposed on the heating plate set to a predetermined temperature to perform the thermal processing for the substrate. The heating plate typically utilizes a heater as a heat source which generates heat through a current conduction. The heat capacity of the heating plate is generally large in order to stabilize the temperature. Therefore, the initiation of a thermal processing of a first substrate needs to be waited until the heating plate temperature reaches the set temperature after the set temperature of the heating plate is changed. As a result, a processing time for the substrate cannot be shortened and a manufacturing cost cannot be reduced.

Further, since the thermal processing apparatus does not have a cooling mechanism to cool down the heating plate, the heating plate temperature cannot be changed rapidly when the set temperature of the heating plate is changed from a high temperature to a low temperature. Therefore, the initiation of a thermal processing of a first substrate needs to be waited until the heating plate temperature reaches the set temperature after the set temperature of the heating plate is changed from the high temperature to the low temperature. As a result, a processing time for the substrate cannot be shortened, and a manufacturing cost cannot be reduced.

Meanwhile, when a thermal processing of a first substrate is initiated before the temperature of the heating plate reaches the set temperature, the heat quantity given to the first substrate by the heating plate is different from that given to a next substrate for which the thermal processing is initiated in a state where with the temperature of the heating plate is maintained at the set temperature, after a thermal processing of the first substrate is completed. Therefore, the characteristics of the coating film, such as a resist film vary between the substrates when a plurality of substrates are processed. In particular, when the thermal processing is a post-exposure baking, critical dimension CD of the resist pattern varies between substrates, which is problematic.

In order to make the temperature of the heating plate reaches the set temperature rapidly, a method of reducing the capacity of the heating plate may also be considered. Alternatively, in order to cool the heating plate rapidly when the set temperature of the heating plate is changed from the high temperature to the low temperature, a method of providing a cooling mechanism such as a cooling gas nozzle, which sprays a cooling gas to the heating plate around the heating plate may also be considered. However, the method for making the capacity of the heating plate to be smaller has a problem in that the strength and performance of the heating plate decrease as the heating plate becomes miniaturized and thinner. Further, the method of providing the cooling mechanism in the vicinity of the heating plate has a problem in that manufacturing cost of the thermal processing apparatus increases.

The present disclosure has been made in consideration of the problems described above to provide a thermal processing method and a thermal processing apparatus in which the processing time of the substrates can be shortened while preventing the characteristics of coated films between substrates from being varied, without decreasing the strength of the heating plate or increasing manufacturing cost of the apparatus.

The present disclosure provides following means necessary for solving the problems described above.

An exemplary embodiment of the present disclosure provides a thermal processing method in which each of a plurality of substrates of a substrate group is sequentially disposed and processed on a heating plate set to a predetermined temperature. The method comprising a first processing which includes changing a set temperature of the heating plate from a first temperature to a second temperature; initiating a thermal processing for a first substrate of the substrate group before the temperature of the heating plate reaches the second temperature; obtaining temperature data of the heating plate after the thermal processing is initiated; changing the set temperature of the heating plate from the second temperature when the set temperature reaches the second temperature based on the obtained temperature data of the heating plate; and thermal processing of the first substrate using the heating plate for which the set temperature has been changed. The method further comprising a second process which includes reinstating the temperature of the heating plate to the second temperature after the thermal processing of the first substrate; and thermal processing of a next substrate of the substrate group using the heating plate while the temperature of the heating plate is maintained at the second temperature.

According to the method, the first process further comprises predicting the heat quantity given to the first substrate by the heating plate when the set temperature of the heating plate is not changed from the second temperature on the basis of the obtained temperature data of the heating plate; and changing the set temperature of the heating plate based on the predicted heat quantity and the heat quantity given to the next substrate by the heating plate. In particular, the heating plate has a plurality of heat sources provided in a concentric shape, and the first process changes a set temperature of each of the heat sources from a first temperature to a second temperature, initiates the thermal processing for the first substrate of the substrate group before the temperature of each of the heat source reaches the second temperature, obtains temperature data of each of the heat source after the thermal processing is initiated, predicts the heat quantity given to the first substrate by each of the heat source when the set temperature of each of the heat source is not changed from the second temperature on the basis of the obtained temperature data of each of the heat source, and changes the set temperature of each of the heat source based on the predicted heat quantity and the heat quantity given to the next substrate by each of the heat source.

Another exemplary embodiment of the present disclosure provides a thermal processing method in which each of a plurality of substrates of a substrate group is sequentially disposed and processed for a predetermined of time on a heating plate set to a predetermined temperature. The method comprises a first process which includes changing a set temperature of the heating plate from a first temperature to a second temperature; initiating a thermal processing for a first substrate of the substrate group before the temperature of the heating plate reaches the second temperature; obtaining temperature data of the heating plate after the thermal processing is initiated; changing a processing time of the first substrate from the predetermined time based on the obtained temperature data of the heating plate; and thermal processing of the first substrate using the heating plate for the changed processing time. The method further comprises a second process which includes reinstating the changed processing time to the predetermined time after the thermal processing of the first substrate; and thermal processing of a next substrate of the substrate group for the predetermined time using the heating plate while the temperature of the heating plate is maintained at the second temperature.

In the thermal processing method described above, the first process further comprises predicting the heat quantity given to the first substrate by the heating plate when the processing time of the first substrate is not changed from predetermined time on the basis of the obtained temperature data of the heating plate; and changing the processing time based on the predicted heat quantity and the heat quantity given to the next substrate by the heating plate. Furthermore, a thermal processing of a test substrate is initiated in advance while the temperature of the heating plate is maintained to the second temperature, the temperature data of the heating plate is obtained while the test substrate is being processed, and the heat quantity given to the next substrate is calculated based on the obtained temperature data of the heating plate.

Further, the exemplary embodiment of the present disclosure provides a non-transitory computer-readable recording medium recording a program for executing the thermal processing method described above.

Another exemplary embodiment of the present disclosure provides a thermal processing apparatus comprising a heating plate configured to be heated with a predetermined temperature and dispose each of substrates of a substrate group including a plurality of substrates thereby sequentially performing a thermal processing for the plurality of substrates; and a control unit configured to control an overall operation of the thermal processing system. In particular, the control unit changes a set temperature of the heating plate from a first temperature to a second temperature; initiates a thermal processing for a first substrate of the substrate group before the temperature of the heating plate reaches the second temperature; obtains temperature data of the heating plate after the thermal processing is initiated; changes the set temperature of the heating plate from the second temperature when the set temperature reaches the second temperature based on the obtained temperature data of the heating plate; thermal processes of the first substrate using the heating plate for which the set temperature has been changed; reinstates the temperature of the heating plate to the second temperature after the thermal processing of the first substrate; and thermal processes of a next substrate of the substrate group using the heating plate while the temperature of the heating plate is maintained at the second temperature.

Further, according to the apparatus, the control unit predicts the heat quantity given to the first substrate by the heating plate when the set temperature of the heating plate is not changed from the second temperature based on the obtained temperature data of the heating plate, and changes the set temperature of the heating plate based on the predicted heat quantity and the heat quantity given to the next substrate by the heating plate. Further, the heating plate has a plurality of heating sources provided in a concentric shape, and the control unit changes a set temperature of each of the heating sources from the first temperature to the second temperature, initiates a thermal processing for a first substrate of the substrate group before the temperature of each of the heating sources reaches the second temperature; obtains temperature data of each of the heating sources after the thermal processing is initiated; changes the set temperature of each of the heating sources from the second temperature when the set temperature reaches the second temperature based on the obtained temperature data of each of the heating sources; thermal processes of the first substrate using each of the heating sources for which the set temperature has been changed; reinstates the temperature of each of the heating sources to the second temperature after the thermal processing of the first substrate; and thermal processes of a next substrate of the substrate group using each of the heating sources while the temperature of each of the heating sources is maintained at the second temperature.

Yet another exemplary embodiment of the present disclosure provides a thermal processing apparatus comprising a heating plate configured to be heated with a predetermined temperature and dispose each of substrates of a substrate group including a plurality of substrates thereby sequentially performing a thermal processing for the plurality of substrates for a predetermined of time; and a control unit configured to control an overall operation of the thermal processing system. In particular, the control unit changes a set temperature of the heating plate from a first temperature to a second temperature; initiates a thermal processing for a first substrate of the substrate group before the temperature of the heating plate reaches the second temperature; obtains temperature data of the heating plate after the thermal processing is initiated; changes a processing time of the first substrate from the predetermined time based on the obtained temperature data of the heating plate; thermal processes of the first substrate using the heating plate for the changed processing time; reinstates the changed processing time to the predetermined time after the thermal processing of the first substrate; and thermal processes of a next substrate of the substrate group for the predetermined time using the heating plate while the temperature of the heating plate is maintained at the second temperature.

Further, according to the apparatus described above, the control unit predicts the heat quantity given to the initial substrate by the heating plate when the thermal processing time of the first substrate is not changed from the predetermined time based on the obtained temperature data of the heating plate and changes the thermal processing time based on the predicted heat quantity and the heat quantity given to the next substrate by the heating plate. Further, the thermal processing of a test substrate is initiated in advance while the temperature of the heating plate is maintained to the second temperature, the temperature data of the heating plate is obtained while the test substrate is being processed, and the heat quantity given to the next substrate is calculated based on the obtained temperature data of the heating plate.

According to exemplary embodiments of the present disclosure, a time for processing substrates can be shortened while preventing the characteristic of coated films between substrates from being varied, without decreasing the strength of the heating plate or increasing manufacturing cost of the apparatus.

Next, exemplary embodiments of the present disclosure will be described with reference to the accompanying drawings.

Hereinafter, a coating and developing system including a thermal processing apparatus according to the exemplary embodiment of the present disclosure will be described with reference to FIGS. 1 to 8.

Figure 2:
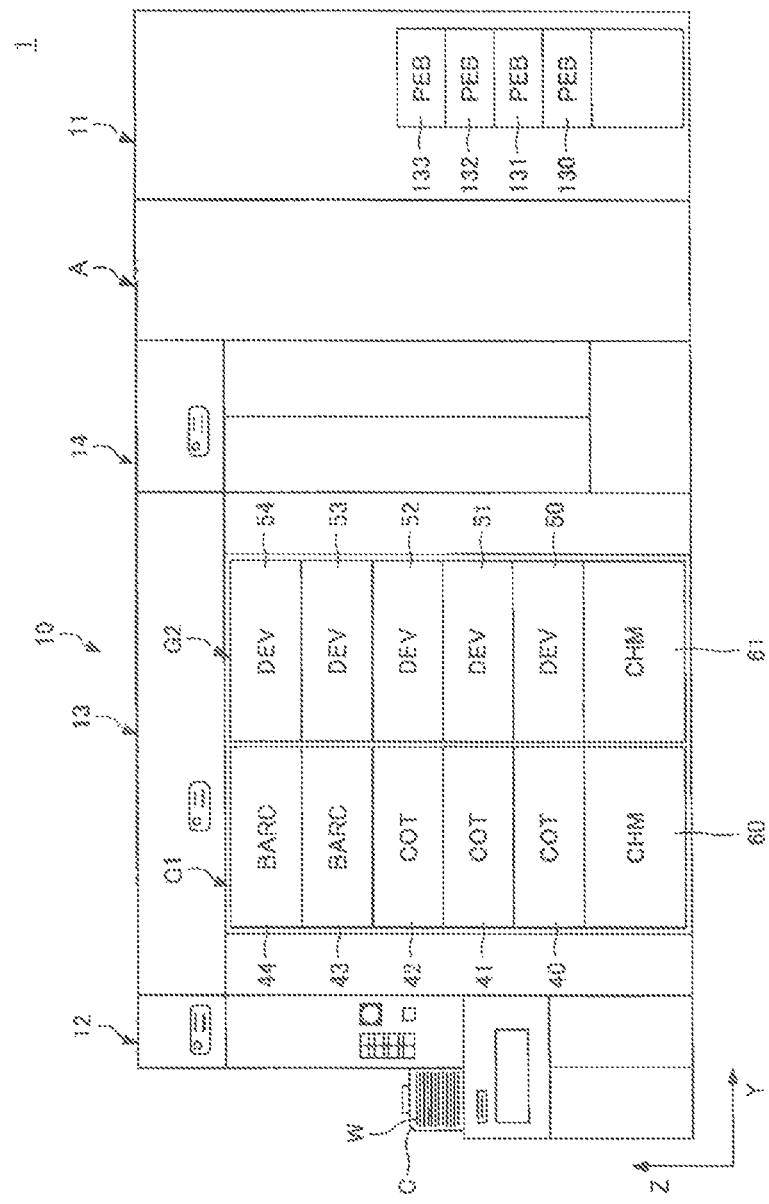
FIG. 2 is a front view of illustrating a schematic configuration of a coating and developing processing system according to an exemplary embodiment of the present disclosure.
Figure 3:
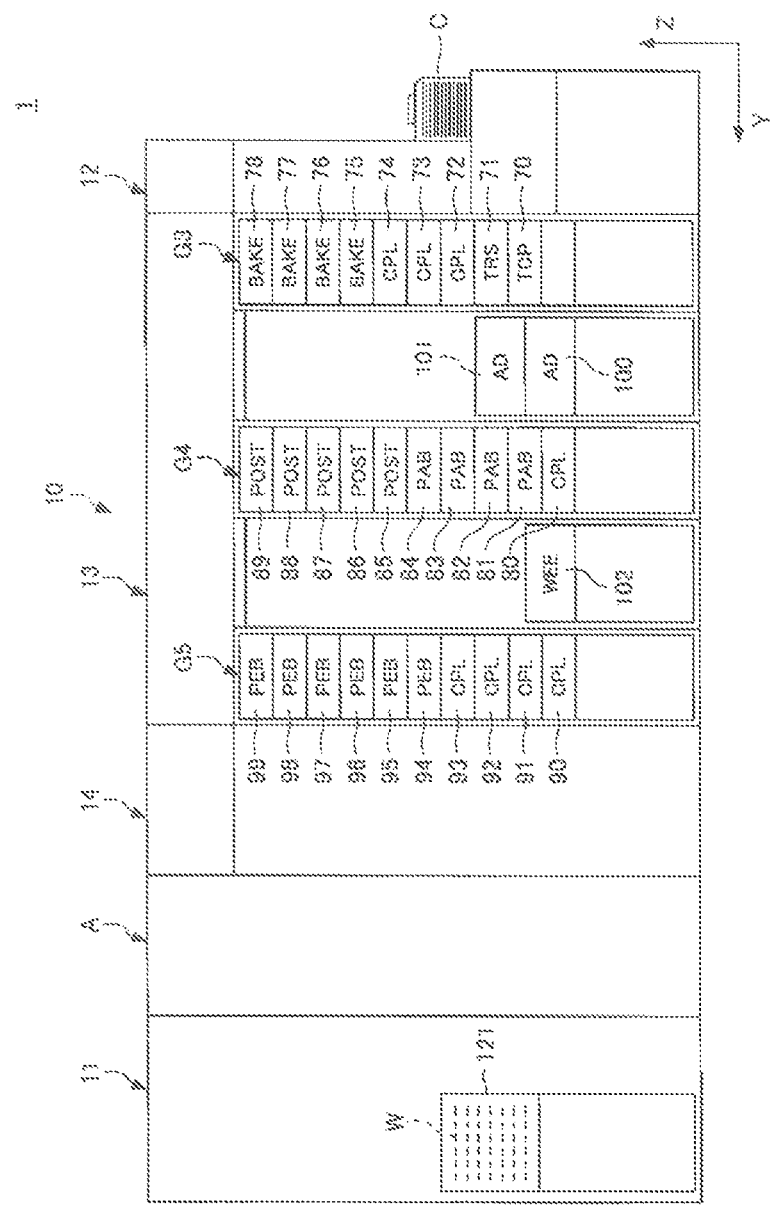
FIG. 3 is a rear view illustrating a schematic configuration of a coating and developing processing system according to an exemplary embodiment of the present disclosure.

The coating and developing system of the present disclosure will be described with reference to FIGS. 1 to 3. FIG. 1 is a plan view illustrating a schematic configuration of coating and developing system according to an exemplary embodiment of the present disclosure. FIG. 2 is a front view illustrating a schematic configuration of the coating and developing system. FIG. 3 is a rear view illustrating a schematic configuration of the coating and developing system.

A coating and developing system 1 includes a first processing system 10 and a second processing system 11 provided at both sides of an exposing apparatus A, as shown in FIG. 1. First processing system 10 is, for example, configured to be connected integrally with a cassette station 12, a processing station 13 and an interface station 14. Cassette station 12 carries in and carries out twenty-five (25) sheets of wafer W by a cassette C for coating and developing system 1 from outside, or carries in and carries out wafer W for cassette C. Processing station 13 is a processing unit in which various types of processing apparatuses each performing a predetermined processing for each sheet of wafer in a photolithographic process are disposed in a multi-stage configuration. Interface station 14 is a transfer unit delivering wafer W to exposure apparatus A. Cassette station 12, processing station 13 and interface station 14 are disposed in order toward the positive side of Y direction (right direction in FIG. 1), and interface station 14 is connected with exposing apparatus A.

A cassette placing table 20, provided in cassette station 12, is configured such that a plurality of cassettes C can be disposed in a line along the X direction (up/down direction in FIG. 1). A transfer device 22 movable along a transfer path 21 in the X direction is provided in cassette station 12. Transfer device 22 is also movable to the wafer arrangement direction of wafers W (Z direction; a vertical direction) accommodated in cassette C to selectively access wafers W disposed in an up/down direction within cassette C. Transfer device 22 is rotatable around the vertical axis (θ direction) to selectively access the respective apparatuses of a third processing apparatus group G3 at processing station 13 side. Third processing apparatus group G3 will be described below.

Processing station 13 includes, for example, five (5) processing apparatus groups G1 to G5 having a plurality of processing apparatuses disposed in a multi-stage configuration. A first processing apparatus group G1 and a second processing apparatus group G2 are disposed in order from cassette station 12 side, at a negative side of X direction (downward direction in FIG. 1) of processing station 13. Third processing apparatus group G3, a fourth processing apparatus group G4 and a fifth processing apparatus group G5 are disposed in order from cassette station 12 side, at a positive side of X direction (upward direction in FIG. 1) of processing station 13. A first transfer apparatus 30 is provided between third processing apparatus group G3 and fourth processing apparatus group G4. First transfer apparatus 30 is configured to selectively access the respective apparatuses within first processing apparatus group G1, third processing apparatus group G3 and fourth processing apparatus group G4 to transfer wafer W. A second transfer apparatus 31 is provided between fourth processing apparatus group G4 and fifth processing apparatus group G5 and configured to selectively access the respective apparatuses within second processing apparatus group G2, fourth processing apparatus group G4 and fifth processing apparatus group G5 to transfer wafer W.

As shown in FIG. 2, in first processing apparatus group G1, liquid processing apparatuses such as resist coating apparatuses (COT) 40, 41 and 42 and bottom anti-reflection coating apparatuses (BARC) 43 and 44 performing liquid processing by supplying a predetermined liquid to wafer W are stacked with a five (5) stage configuration in sequence from the bottom. Resist coating apparatuses (COT) 40, 41 and 42 apply resist liquid on wafer W to form a resist film. Bottom coating apparatuses (BARC) 43 and 44 form an anti-reflecting film preventing reflection of light caused by exposure. In second processing apparatus group G2, liquid processing apparatuses such as developing processing apparatuses (DEV) 50 to 54 performing developing process by supplying developing liquid to wafer W are stacked with a five (5) stage configuration in sequence from the bottom. Further, chemical chambers (CHM) 60 and 61 are provided at the lowermost stages of processing apparatus groups G1 and G2, respectively, for supplying various kinds of processing liquids to the liquid processing apparatuses within each of processing apparatus groups G1 and G2.

For example, as shown in FIG. 3, in third processing apparatus group G3, temperature control apparatus (TCP) 70, transition apparatus (TRS) 71, high-precision temperature control apparatuses (CPL) 72 to 74 and thermal processing apparatuses (BAKE) 75 to 78 are stacked with a nine (9) stage configuration in sequence from the bottom. Transition apparatus 71 delivers wafer W, high-precision temperature control apparatuses (CPL) 72 to 74 adjust temperature of wafer W under a high-precision temperature control, and thermal processing apparatuses 75 to 78 perform a thermal processing for wafer W.

In fourth processing apparatus group G4, high-precision temperature control apparatus (CPL) 80, pre-baking apparatuses (PAB) 81 to 84 and post baking apparatuses (POST) 85 to 89 are stacked with a ten (10) stage configuration in sequence from the bottom. Pre-baking apparatuses 81 to 84 perform a thermal processing for wafers W with the coating process has been completed. Post baking apparatuses (POST) 85 to 89 perform a thermal processing for wafers W with the developing process has been completed.

In fifth processing apparatus group G5, a plurality of apparatuses performing a thermal processing for wafers W, for example, high-precision temperature control apparatuses (CPL) 90 to 93 and post-exposure baking apparatuses (PEB) 94 to 99 as thermal processing apparatus are stacked with a ten (10) stage configuration in sequence from the bottom.

As shown in FIG. 1, a plurality of processing apparatuses are disposed in a positive side of X direction (upward direction in FIG. 1) of first transfer apparatus 30. As shown in FIG. 3, adhesion apparatuses (AD) 100 and 101 are stacked with a two (2) stage configuration in sequence from the bottom for hydrophobizing wafers W appropriate for processing. As shown in FIG. 1, a periphery exposure apparatus (WEE) 102 selectively exposing the edge portion of wafer W only is disposed in a positive side of X direction.

For example, as shown in FIG. 1, a wafer transfer unit 111 moving on a transfer path 110 extended and elongated toward the X direction and a buffer cassette 112 are provided in interface station 14. Wafer transfer unit 111 is movable in the Z direction and also rotatable in the θ direction, and is configured to access exposing apparatus A adjacent to interface station 14, buffer cassette 112 and the respective apparatuses within fifth processing apparatus group G5 to transfer wafer W.

In second processing system 11, a wafer transfer apparatus 120 serving as a transfer apparatus, a sixth processing apparatus group G6 and buffer cassette 111 serving as an accommodating unit are provided. Wafer transfer apparatus 120 is movable on a transfer path 123 provided at exposure apparatus A side and extended in the X direction. Wafer transfer apparatus 120 is movable in the Z direction and also rotatable in the θ direction, and is configured to access exposing apparatus A, sixth processing apparatus group G6 and a buffer cassette 121 to transfer wafer W. Wafer transfer apparatus 120 has an alignment function adjusting the position of wafer W.

Sixth processing apparatus group G6 and buffer cassette 121 are arranged and provided in the X direction at the positive side of Y direction of transfer path 123. In sixth processing apparatus group G6, post-exposure baking apparatuses (PEB) 130 to 133 serving as a thermal processing apparatus are stacked with a four (4) stage configuration in sequence from the bottom, as shown in FIG. 2. Buffer cassette 121 is configured to temporarily accommodate multiple sheets of wafers W (See, e.g., FIG. 3).

Further, as shown in FIG. 1, cassette station 12 is provided with a critical dimension measuring apparatus 140 measuring the critical dimension of the resist pattern on wafer W.

Next, the post-exposure baking apparatus corresponding to the thermal processing apparatus in the exemplary embodiment of the present disclosure will be described with reference to FIGS. 4 to 7.

Figure 4:
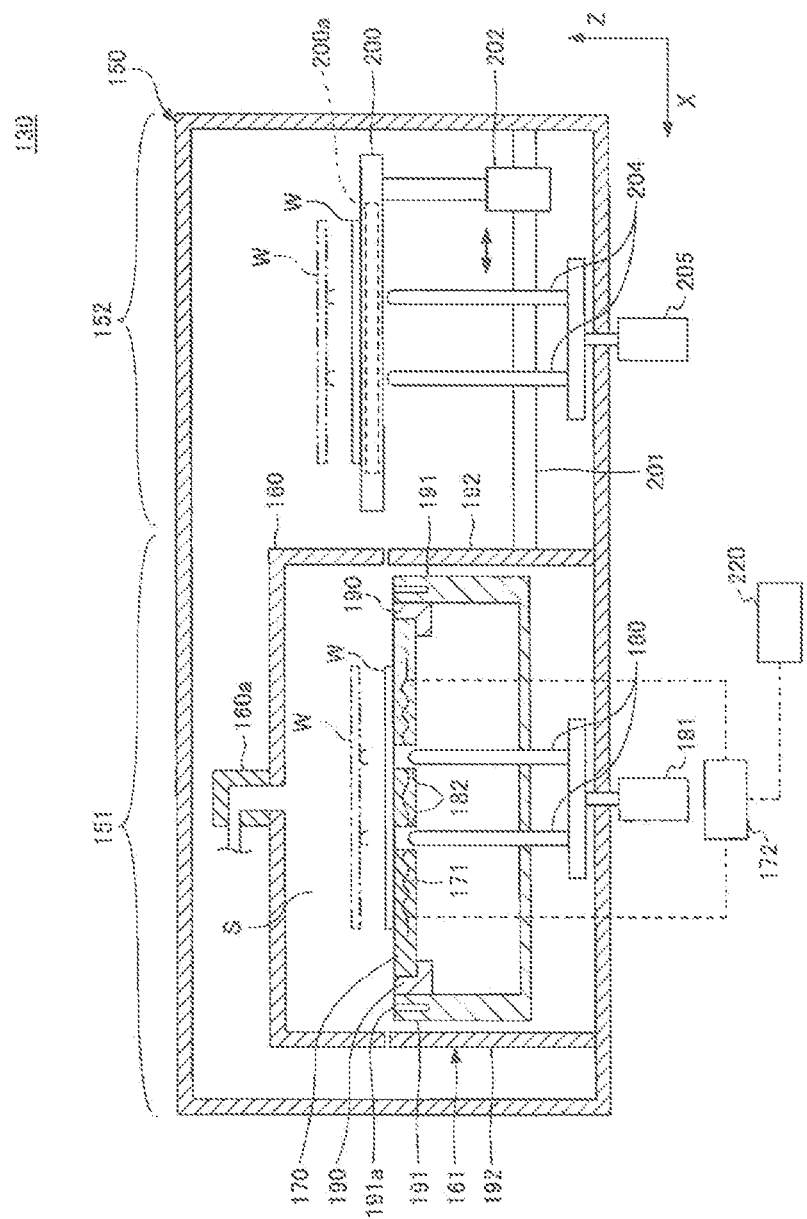
FIG. 4 is a longitudinal cross-sectional view illustrating a schematic configuration of a post-exposure baking apparatus according to an exemplary embodiment of the present disclosure.
Figure 5:
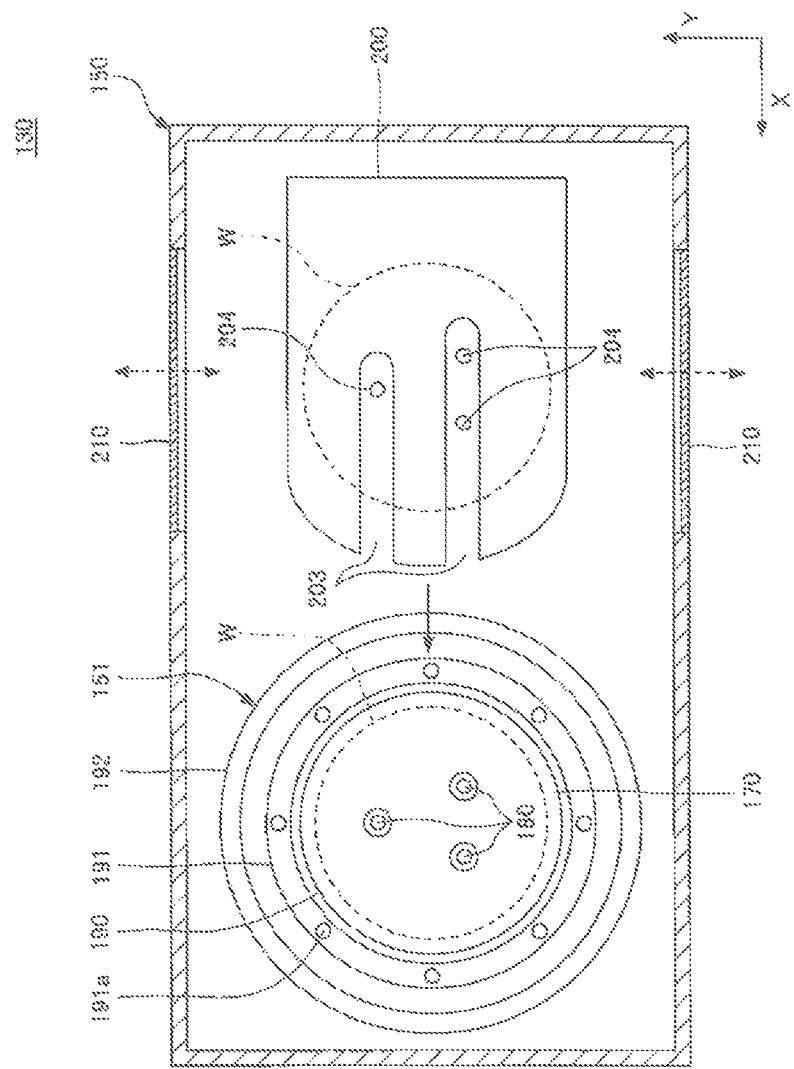
FIG. 5 is a transverse cross-sectional view illustrating a schematic configuration of the post-exposure baking apparatus according to an exemplary embodiment of the present disclosure.
Figure 6:
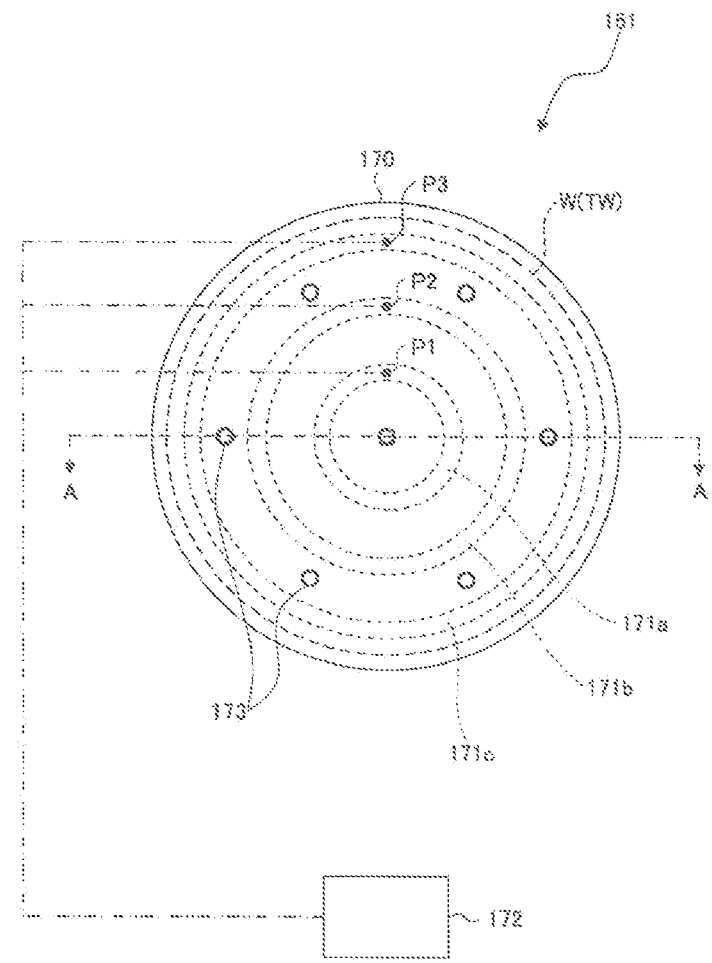
FIG. 6 is an enlarged plan view illustrating a heating plate.
Figure 7:
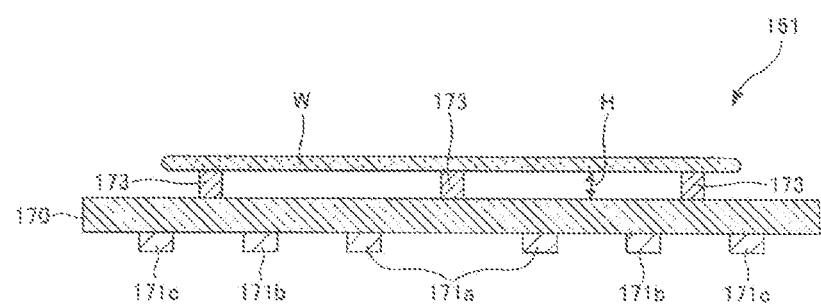
FIG. 7 is a longitudinal cross-sectional view taken along the line A-A of FIG. 6.

FIG. 4 is a longitudinal cross-sectional view illustrating a schematic configuration of the post-exposure baking apparatus according to an exemplary embodiment of the present disclosure. FIG. 5 is a transverse cross-sectional view illustrating a schematic configuration of the post-exposure baking apparatus according to an exemplary embodiment of the present disclosure. FIG. 6 is an enlarged plan view illustrating a heating plate. FIG. 7 is a longitudinal cross-sectional view taken along the line A-A of FIG. 6. For the convenience of illustration, a first elevating pin and a through-hole or the like are omitted in FIGS. 6 and 7.

As shown in FIGS. 4 and 5, a post-exposure baking apparatus 130 includes a heating unit 151 and a cooling unit 152 heating and cooling wafer W, respectively in a casing 150.

As shown in FIG. 4, heating unit 151 includes a cover 160 located at an upper side thereof and movable up and down, and a heating plate accommodating unit 161 located at a lower side thereof to form a processing chamber S integrally with cover 160.

An exhausting portion 160a is provided at the center of the ceiling part of cover 160 and configured to uniformly exhaust atmosphere within processing chamber S from exhausting portion 160a.

A heating plate 170 in which wafer W is disposed and heated is provided at the center of heating plate accommodating unit 161. Heating plate 170 is formed as a substantially disk-shape which is larger than wafer W and has a thickness. A heater 171 is incorporated in heating plate 170 generating heat by supplying an electric current. A heat quantity to be generated is adjusted, for example, by a heater control apparatus 172. A temperature control is performed, for example, by a main body control unit 220 which will be describe herein below.

Heater control apparatus 172 and main body control unit 220 correspond to a control unit in the exemplary embodiment of the present disclosure.

As shown in FIGS. 6 and 7, heater 171 is composed of a plurality of heaters 171a to 171c arranged in concentric circles at an appropriate interval and, as described above, incorporated in heating plate 170. Further, each of heaters 171a to 171c is connected with heater control apparatus 172 independently.

In FIG. 6, heater 171 is composed of three (3) heaters 171a to 171c, but may also be composed of a plurality of heaters without being limited to three heaters.

A plurality of temperature sensors (not shown) are provided at a plurality of positions P1, P2 and P3 in heating plate 170 corresponding to the respective heaters 171a to 171c to independently control the respective heaters 171a to 171c, such that heating plate temperature PV can be measured by the respective temperature sensors. Further, heating plate temperature PV measured by respective temperature sensors is inputted to heater control apparatus 172 which is configured to control output of the respective heaters 171a to 171c based on the difference between heating plate temperature PV and a set temperature.

As shown in FIGS. 6 and 7, gap pins 173 supporting wafer W to be separated from heating plate 170 with a gap are provided to prevent particles or the like from being adhered to wafer W. In an example shown in FIG. 6, gap pins 173 are provided at seven sites and wafer W is supported by the provided seven gap pins 173. Gap pins 173 are configured to support wafer W with maintaining a gap (a gap height; H) corresponding to the height from the top surface of heating plate 170 to the top surface of gap pins 173. Gap height H, in such a case, for example, may be 0.1 mm to 0.3 mm. Further, gap pins 173 are formed to conduct heat from the surface of heating plate 170 mainly through air in a state where wafer W is being supported by gap pins 173 with maintaining the gap as described above.

As shown in FIG. 4, a first elevating pin 180 supporting and elevating wafer W from down side is provided at the side below heating plate 170. First elevating pins 180 are movable up and down by an elevation driving mechanism 181. Through-holes 182 penetrating through heating plate 170 in thickness direction is formed in the vicinity of central portion of heating plate 170. First elevating pins 180 may move upward from downside of heating plate 170, pass through through-holes 182 and protrude upward of heating plate 170.

Heating plate accommodating unit 161 has an annular-shaped maintaining member 190 accommodating heating plate 170 and maintaining the outer periphery of the heating plate, and a substantially cylindrical-shaped support ring 191 surrounding the outer periphery of annular-shaped maintaining member 190. A ventilation port 191a ventilating, for example, inert gas toward processing chamber S is formed on the top surface of support ring 191. The inert gas can be ventilated to purge inside of processing chamber S. Further, a cylindrical case 192 defining the outer periphery of heating plate accommodating unit 161 is provided outside support ring 191.

In cooling unit 152 adjacent to heating unit 151, there is provided, for example, a cooling plate 200 for cooling wafer W that is placed thereon. Cooling plate 200 has, for example, an approximately square plate shape as shown in FIG. 5, and the edge surface at heating plate 170 side is convexly curved outwardly in an arc shape. As shown in FIG. 4, inside cooling plate 200, a cooling member 200a such as a Peltier device is incorporated to adjust cooling plate 200 at a predetermined set temperature.

Cooling plate 200 is attached to a rail 201 extending toward heating unit 151, and travels on rail 201 by a driving unit 202, and moves up to the upper side of heating plate 170 at heating unit 151.

In cooling plate 200, two slits 203 are formed along the X direction as shown, for example, in FIG. 5. Slits 203 are formed from the edge surface of cooling plate 200 at heating unit 151 side to the vicinity of the center of cooling plate 200. By slits 203, the interference between cooling plate moved to heating unit 151 side and first elevation pins 180 protruding on heating plate 170, is prevented. As shown in FIG. 4, second elevation pins 204 are provided at the lower side of cooling plate 200 and configured to be elevated by an elevation driving unit 205. Second elevation pins 204 may rise from the lower side of cooling plate 200, pass through slits 203, and protrude to the upper side of cooling plate 200.

As shown in FIG. 5, in both of that walls of casing 150 that cooling plate 200 is placed therebetween, carrying in/out ports 210 are formed for carrying in and out wafer W.

Since other post-exposure baking apparatuses 94 to 99 and 131 to 133 have the same configuration as post-exposure baking apparatus 130 described above, a description thereof will be omitted.

Other post-exposure baking apparatuses 94 to 99 and 131 to 133 have the same configuration as post-exposure baking apparatus 130 as described above, and thus, description will be omitted.

Figure 8:
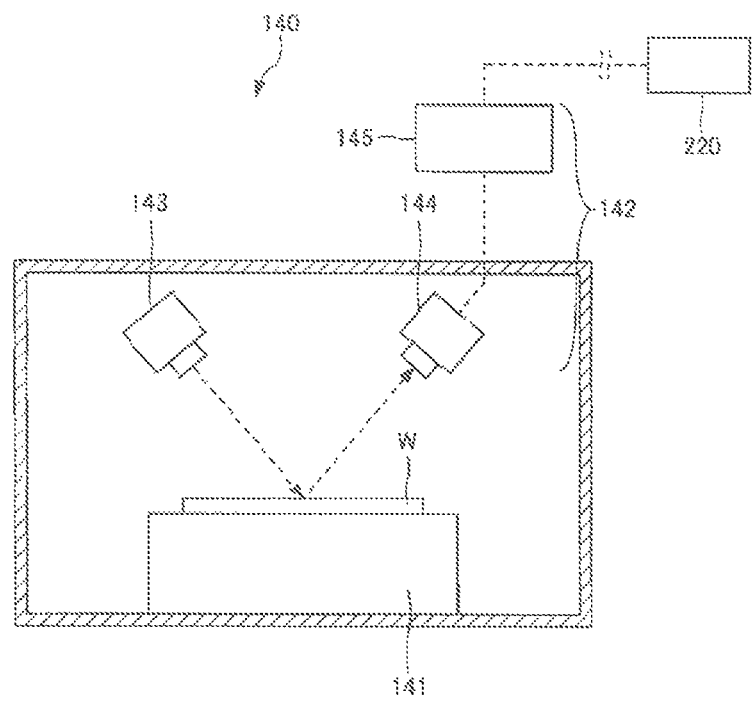
FIG. 8 is a longitudinal cross-sectional view illustrating a schematic configuration of a critical dimension measuring apparatus.

As shown in FIG. 8, for example, critical dimension measuring apparatus 140 includes a placing table 141 that arranges wafer W horizontally, and an optical surface profilometer 142. Placing table 141 is formed of, for example, an X-Y stage so as to move horizontally in a two-dimensional direction. Optical surface profilometer 142 includes, for example, a light irradiating unit 143, a light detecting unit 144 and a calculating unit 145. Light irradiating unit 143 irradiates light from an inclined direction with respect to wafer W. Light detecting unit 144 detects the light that is irradiated from light irradiating unit 143 and reflected from wafer W. Calculating unit 145 calculates critical dimension CD of the resist pattern on wafer W based on the light receiving information of light detecting unit 144. Critical dimension measuring apparatus 140 measures critical dimension CD of the resist pattern using, for example, a scatterometry method. When using the scatterometry method, calculating unit 145 compares the light intensity distribution in the plane of wafer W detected by light detecting unit 144 to a virtual light intensity distribution stored in advance. And, critical dimension CD of a resist pattern can be measured by obtaining critical dimension CD of the resist pattern corresponding to the virtual light intensity distribution.

In addition, critical dimension measuring apparatus 140 can measure critical dimension CD at a plurality of measuring points in the plane of wafer W by moving wafer W relatively horizontally with respect to light irradiating unit 143 and light detecting unit 144.

In coating and developing processing system 1 having above-mentioned configuration, coating and developing process is performed as follows.

First, using wafer transfer unit 22 as shown in FIG. 1, unprocessed wafer W is carried-out one by one from cassette C on cassette placing table 20, and transferred sequentially to processing station 13. Wafer W is then transferred to temperature control apparatus 70, which belongs to third processing apparatus group G3, to control the temperature to a predetermined temperature. Then, wafer W is transferred to, for example, bottom coating apparatus 43 by first transfer apparatus 30 to form an anti-reflection coating. Subsequently, wafer W is transferred to thermal processing apparatus 75 and high-precision temperature control apparatus 80 sequentially by first transfer apparatus 30 to be subjected to a predetermined processing in each processing apparatus. Wafer W is then transferred to, for example, resist coating apparatus 40 by first transfer apparatus 30.

In resist coating apparatus 40, for example, a predetermined amount of resist liquid is supplied to the rotating surface of wafer W from a nozzle. And then, the resist liquid is spread into the entire surface of wafer W to form a resist coating on wafer W.

Wafer W that has a resist coating formed thereon is transferred to, for example, pre-baking apparatus 81 by first transfer apparatus 30 to be subjected to a thermal processing (pre-bake). Then, wafer W is transferred to peripheral exposing apparatus 102 and high-precision temperature control apparatus 93 sequentially by second transfer apparatus 31 to be subjected to a predetermined processing in each processing apparatus. Wafer W is then transferred to exposing apparatus A by wafer transfer unit 111 of interface station 14. When wafer W is transferred to exposing apparatus A, a light is irradiated from a light source onto the resist coating of wafer W via a mask to expose a predetermined pattern on the resist coating. In this way, wafer W is subjected to an exposure process.

After the exposure is completed, wafer W is transferred to, for example, post-exposure baking apparatus 94 of processing station 13 by wafer transfer unit 111 of interface station 14. In post-exposure baking apparatus 94, wafer W is first carried in from carrying in/out ports 210, and is arranged on cooling plate 200 as shown in FIG. 4. Continuously, as cooling plate 200 moves, wafer W moves to the upper side of heating plate 170. Wafer W is delivered from cooling plate 200 to first elevation pins 180, and then placed on heating plate 170 by first elevation pins 180. In this way, the thermal processing (post-exposure baking) of wafer W is initiated. And, after a predetermined time is lapsed, wafer is separated from heating plate 170 by first elevation pins 180 to terminate the thermal processing of wafer W. Wafer W is then delivered from first elevation pins 180 to cooling plate 200 to be cooled, and transferred from cooling plate 200 to the outside of post-exposure baking apparatus 94 via carrying in/out port 210.

After the post-exposure baking is completed, wafer W is transferred to, for example, developing processing apparatus 50 by second transfer apparatus 31 to develop the resist coating on wafer W. Then, wafer W is transferred to post baking apparatus 85, for example, by second transfer apparatus 31 to perform thermal processing (post bake), and then, transferred to high-precision temperature control apparatus 72 to control the temperature. Wafer W is then returned to cassette C of cassette station 12 by wafer transfer unit 22. In this way, a series of wafer processing is completed in coating and developing processing system 1.

The coating and developing process, including the thermal process performed in coating and developing processing system 1, is controlled by, for example, main body control unit 220 shown in FIG. 1. Main body control unit 220 also controls measuring of critical dimension CD of the resist pattern on wafer W by critical dimension measuring apparatus 140. Main body control unit 220 is formed of a general-purpose computer including, for example, CPU, memory and the like, and is capable of controlling the wafer processing or the critical dimension measuring by performing a program stored therein. The program in main body control unit 220 may be the one provided therein by a computer readable recording medium. Furthermore, the program for performing the thermal processing according to the exemplary embodiment as described below may be the one provided in main body control unit 220 or heater control apparatus 172 by a computer readable recording medium.

Figure 9:
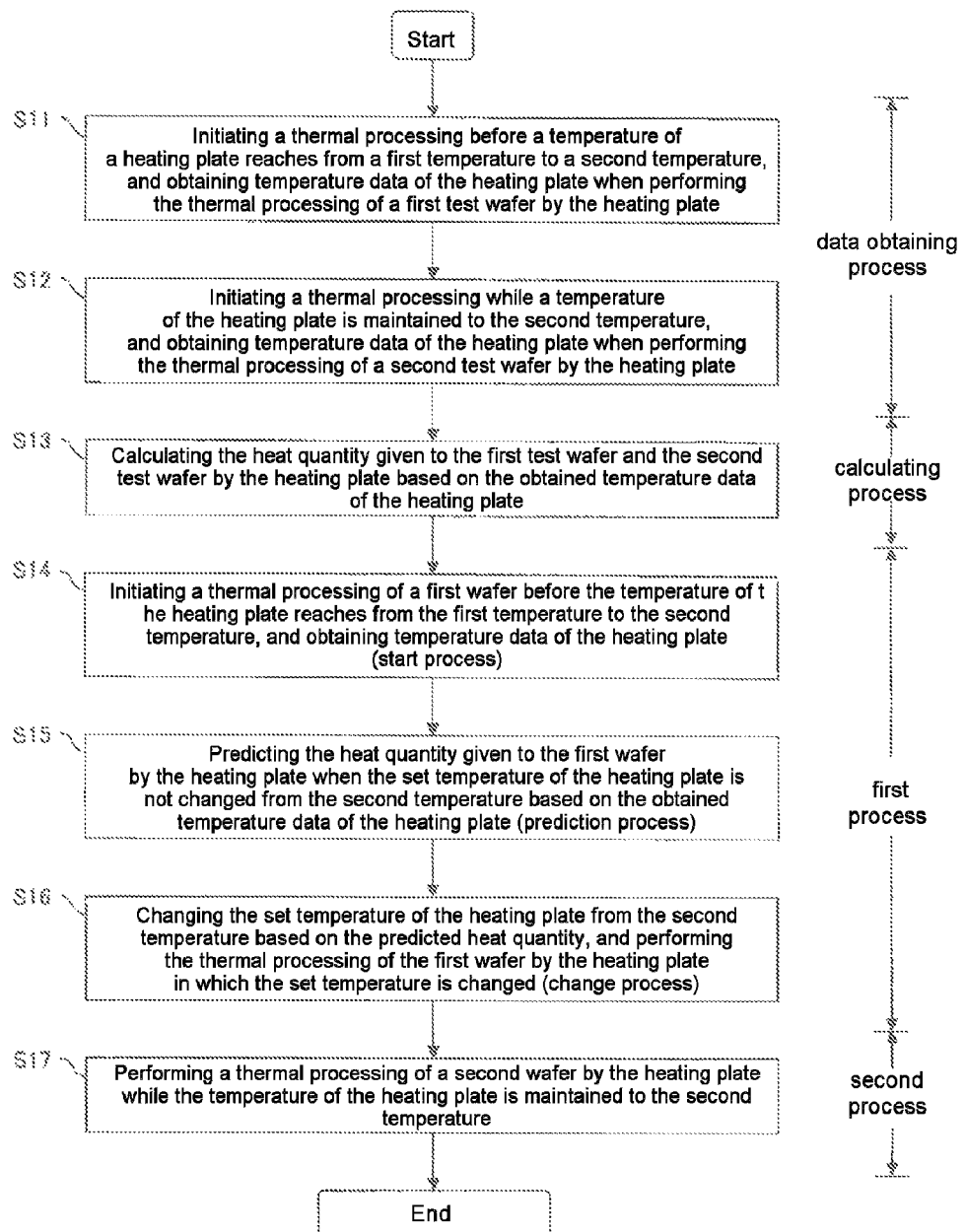
FIG. 9 is a flowchart explaining the sequence of a thermal processing method according to an exemplary embodiment of the present disclosure.
Figure 10:
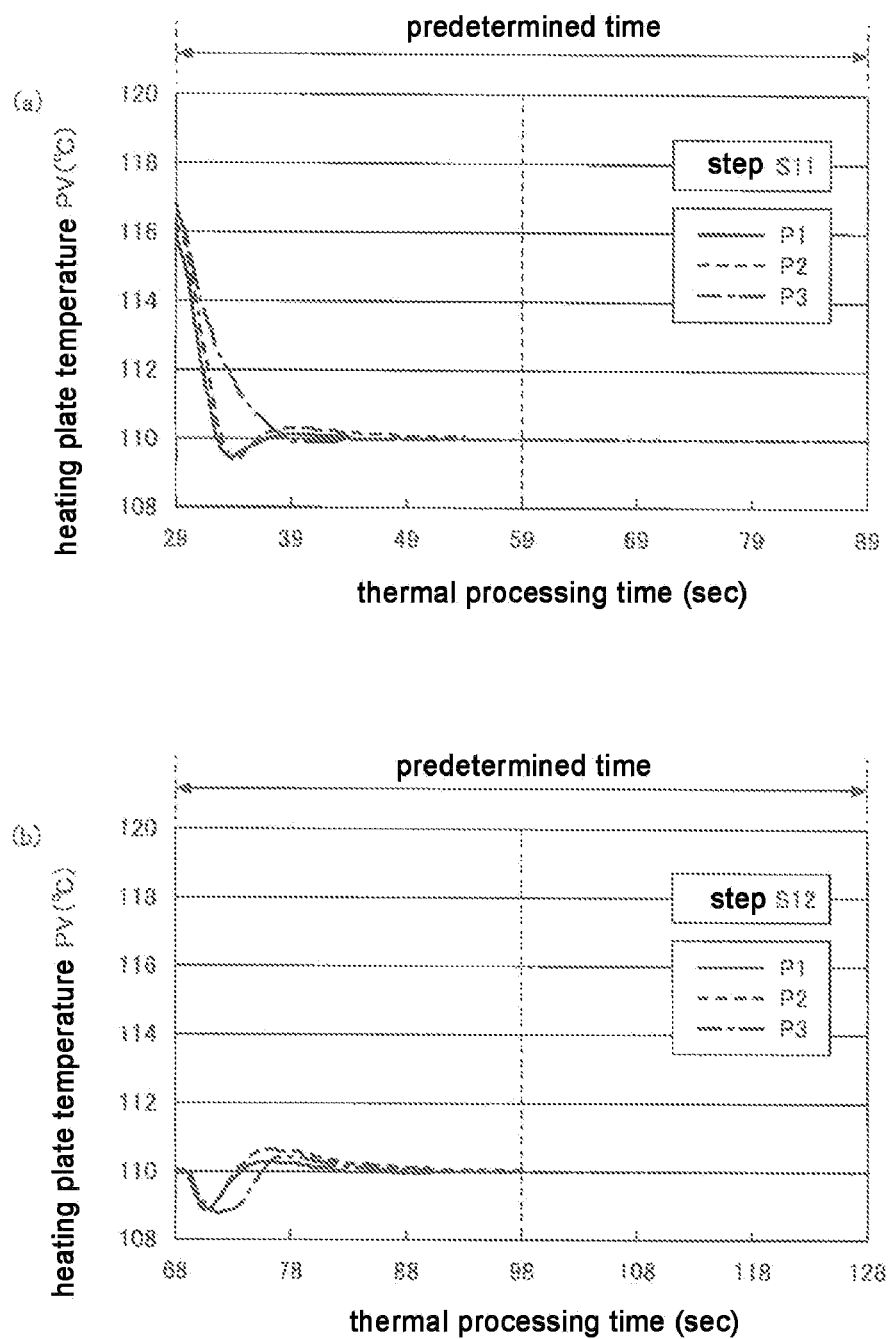
FIG. 10 is a graph plotting the change in a heating plate temperature over a time period at steps S11 and S12.
Figure 11:
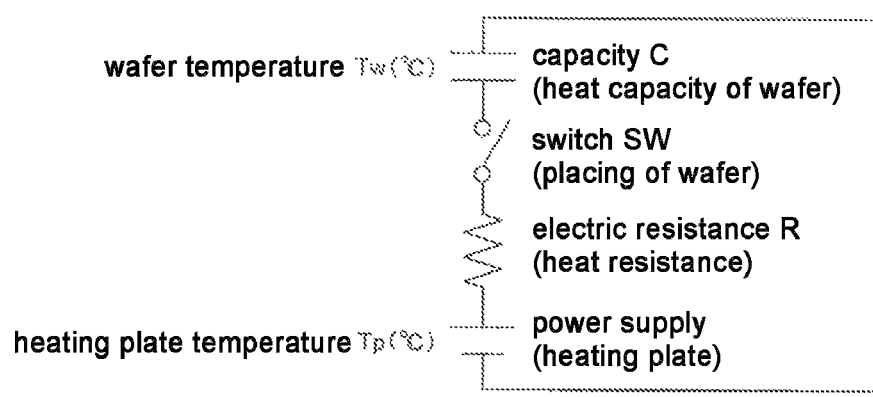
FIG. 11 is a diagram showing a phenomenon in which the heat quantity is given to a wafer by a heating plate as an equivalent circuit.
Figure 12:
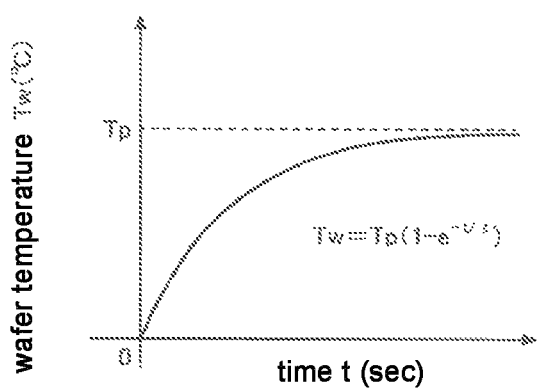
FIG. 12 is a graph showing a change in the wafer temperature over a time period assuming that the temperature of the heating plate is constant.
Figure 13:
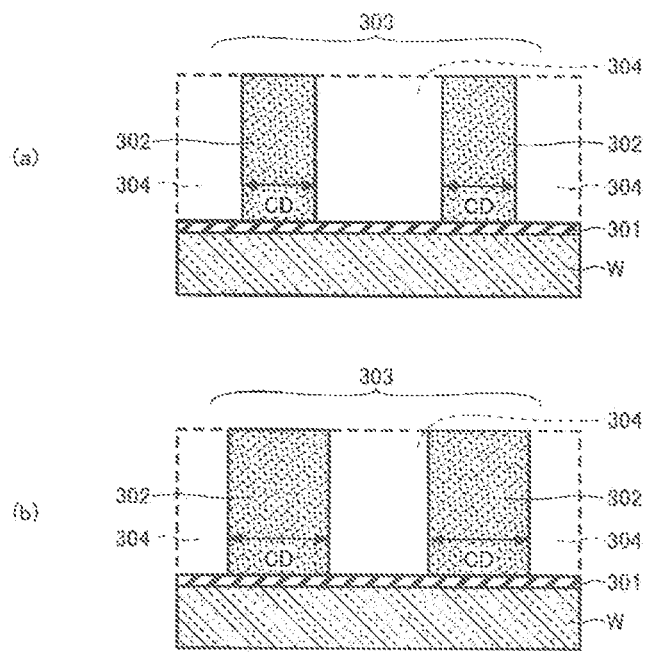
FIG. 13 is a schematic cross-sectional view of a resist pattern formed by performing a post-exposure bake under the same thermal processing condition as steps S11 and S12 and a developing processing, after an exposure process.
Figure 14:
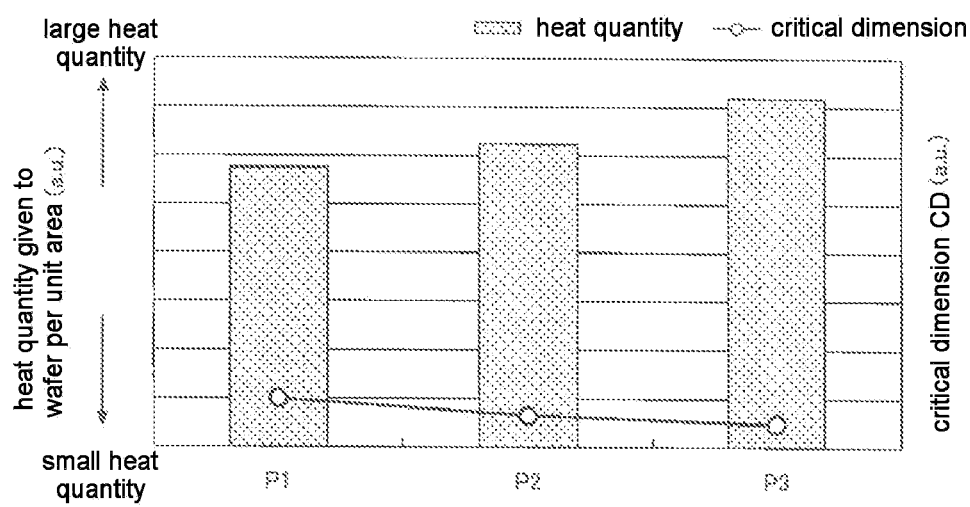
FIG. 14 is a graph showing critical dimension CD of a resist pattern formed by performing a post-exposure bake under the same thermal processing condition as step S11 by comparing among positions corresponding to the positions of heat sources.
Figure 15:
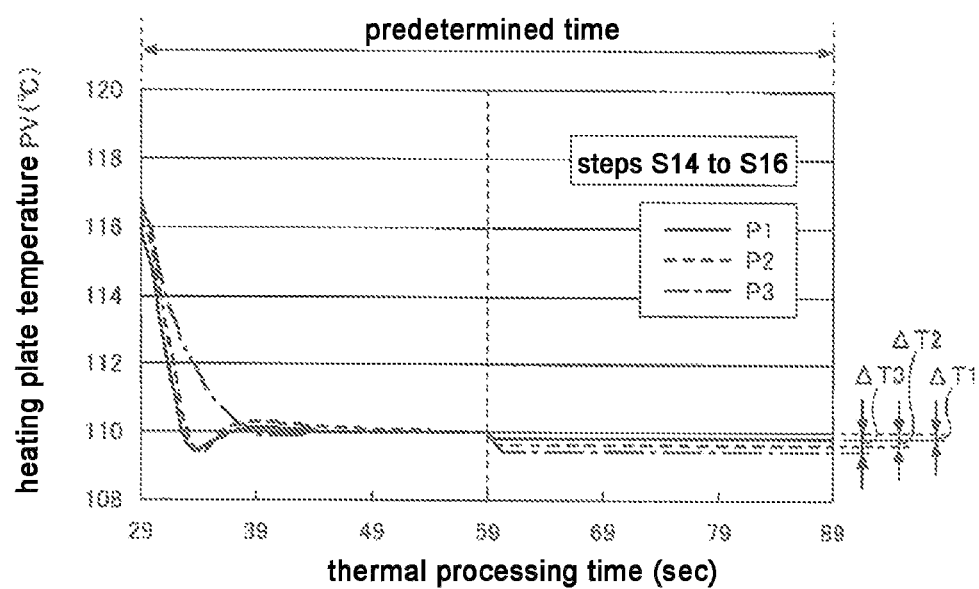
FIG. 15 is a graph showing a change in the temperature of the heating plate over a time period in a first process.

Next, referring to FIGS. 9 to 15, a thermal processing method will be described. FIG. 9 is a flowchart for explaining the sequence of each process in a thermal processing method according to an exemplary embodiment of the present disclosure. FIGS. 10(a) and 10(b) are graphs showing the change in heating plate temperature PV over a time period at steps S11 and S12. FIG. 11 is a diagram showing a phenomenon in which the heat quantity is given to wafer W by a heating plate 170 as an equivalent circuit. FIG. 12 is a graph showing a change in wafer temperature WT over a time period, assuming that heating plate temperature PV is constant. FIG. 13 is a schematic cross-sectional view of a resist pattern formed by performing post-exposure bake under the same thermal processing condition as steps S11 and S12, and performing a developing processing, after the exposure process. FIG. 14 is a graph showing critical dimension CD of a resist pattern formed by performing a post-exposure bake under the same thermal processing condition as step S11 by comparing among positions corresponding to the positions of heat sources. FIG. 15 is a graph showing a change in the heating plate temperature PV over a time period in a first process.

As shown in FIG. 9, the thermal processing method according to the exemplary embodiment of the present disclosure includes a data obtaining process (steps S11 and S12), a calculating process (step S13), a first process (steps S14 to S16), and a second process (step S17).

In the thermal processing method according to the exemplary embodiment of the present disclosure, a thermal processing temperature of the latter half of the thermal processing that initiates prior to reaching the set temperature is changed so that a predetermined heat quantity given to a wafer when a thermal processing is initiated prior to reaching a set temperature is the same as the predetermined heat quantity given to the wafer when the thermal processing is initiated following reaching the set temperature. As a result, the thermal processing method according to the exemplary embodiment of the present disclosure includes a measuring process that measures the predetermined heat quantity and a thermal process of the wafer that actually performs the thermal processing on the basis of the measured predetermined heat quantity. The measuring process includes the data obtaining process (steps S11 and S12) and the calculating process (step S13). In addition, the thermal process includes the first process (steps S14 to S16) and the second process (step S17). Further, the first process includes an initiating process (step S14), a prediction process (step S15), and a change process (step S16).

In step S11, a set temperature of a heating plate 170 is changed from a first temperature T1 to a second temperature T2 and before the temperature of heating plate 170 in which the set temperature is changed reaches second temperature T2 from first temperature T1, a first test wafer TW1 is placed on heating plate 170 and the thermal process is initiated at a third temperature T3 between first temperature T1 and second temperature T2. In addition, a thermal process is performed for first test wafer TW1 by heating plate 170 in which the set temperature is changed to second temperature T2. A heating plate temperature PV for heating plate 170 is measured when performing the thermal processing of first test wafer TW1. As a result, temperature data of heating plate temperature PV is obtained. In addition, after the thermal processing is performed for a predetermined time, first test wafer TW1 is carried out from heating plate 170.

As described above, a heater 171 is divided into a plurality of heaters 171a to 171c. Therefore, a set temperature of each of heaters 171a to 171c is changed from first temperature T1 to second temperature T2. In addition, before heating plate temperatures PV at positions P1, P2, and P3 corresponding to heaters 171a, 171b, and 171c, respectively, reach second temperature T2, first test wafer TW1 is placed on heating plate 170 and the thermal processing is performed at third temperature T3 between first temperature T1 and second temperature T2. Further, a thermal processing is performed for first test wafer TW1 by heating plate 170 in which the set temperature is changed to second temperature T2, and heating plate temperatures PV for heating plate 170 at a plurality of positions P1, P2, and P3 corresponding to heaters 171a, 171b, and 171c, respectively, are measured.

In regards to heating plate temperature PV, for example, temperature sensors are provided at positions P1 to P3 shown in FIG. 6 to measure heating plate temperatures PV at positions P1 to P3 every a predetermined time, for example, 1 second, and the measured heating plate temperatures PV is input and stored in a heater control apparatus 172.

First temperature T1 and second temperature 12 may be set to different values for each of heaters 171a to 171c. As a result, the temperatures may be adjusted to improve the uniformity of an in-plane critical dimension CD of wafer W.

Further, by using as first test wafer TW1, a wafer attached with a thermocouple in which for example, temperature sensors including the thermocouples are provided at plural sites of the wafer, a wafer temperature WT may be measured.

Next, at step S12, while the temperature of heating plate 170 is maintained to second temperature, a second test wafer TW2 is placed on heating plate 170 and a thermal process is initiated. In addition, a thermal process of second test wafer TW2 is performed at second temperature T2 by heating plate 170. Heating plate temperature PV for heating plate 170 is measured when performing the thermal processing of second test wafer TW2 at second temperature T2. As a result, temperature data of heating plate temperature PV is obtained. In addition, after thermal processing is performed for a predetermined time, second test wafer TW2 is carried out from heating plate 170.

Even at step S12, heating plate temperatures PV at positions P1 to P3 are measured at an interval of a certain period of time, for example, every 1 second, and the measured heating plate temperature PV is input and stored in heater control apparatus 172. In addition, second temperature T2 may be set to different values for each of heaters 171a to 171c.

Further, by using as second test wafer TW2, a wafer attached with the thermocouple in which for example, the temperature sensors including the thermocouples are provided at plural sites of the wafer, wafer temperature WT may be measured.

Second test wafer TW2 corresponds to a test substrate in the exemplary embodiment of the present disclosure.

Examples of the temperature data of heating plate temperatures PV obtained in the data obtaining process (steps S11 and S120) are shown in FIGS. 10(a) and 10(b), respectively.

At step S11, the set temperature of heating plate 170 is changed from first temperature T1 (e.g., 140° C.) to second temperature T2 (e.g., 110° C.). In addition, as shown in FIG. 10(a), when heating plate temperature PV becomes third temperature T3 (e.g., 117° C.) before reaching second temperature T2 (e.g., 110° C.), first test wafer TW1 is placed and the thermal process is initiated. Therefore, heating plate temperature PV falls is lowered to reach second temperature T2 (e.g., 110° C.) even after the thermal processing for first test wafer TW1 is initiated.

Further, at step S12, while heating plate temperature PV is maintained to second temperature T2 (e.g., 110° C.), second test wafer TW2 is placed and the thermal process is initiated. Therefore, as shown in FIG. 10(b), heating plate temperature PV is slightly changed after the thermal processing for second test wafer TW2 is initiated, however, heating plate temperature PV is thereafter maintained to second temperature T2 (e.g., 110° C.).

Next, in the calculating process (step S13), the heat quantity given to first test wafer TW1 and second test wafer TW2 by heating plate 170 is calculated based on the obtained temperature data of heating plate temperature PV.

As shown in FIG. 7, when wafer W is placed at a position of a gap height H from heating plate 170, in a temperature range of heating plate temperature PV, convection and radiation may be minimal and can be disregarded in transferring heat to wafer W from heating plate 170, and heat conduction through air appears to be dominant. In this case, the flow of heat by heat conduction through air may be substituted by an equivalent circuit assuming that heating plate 170 is a DC power supply, wafer W is a condenser of a capacitance C, a heat resistance in heat conduction through air in gap height H is an electric resistance of a resistance value R, as shown FIG. 11. Further, it is assumed that heating plate temperature PV is a predetermined temperature Tp, and a time constant is τ. Then, wafer temperature WT at a time t is given by Equation 1 and Equation 2.

[Equation 1]

$$Tw = Tp(1 - e^{-t/\tau}) \quad (1)$$

[Equation 2]

$$\tau = \frac{1}{CR} \quad (2)$$

A change in wafer temperature WT over a time period as shown in Equation 1 is shown in FIG. 12.

In this case, assuming that an area of wafer W is S, and thermal conductivity of air is κ, the heat quantity given to wafer W for unit time at the time t is then given by Equation 3.

[Equation 3]

$$Q = \frac{S\kappa}{H}(Tp - Tw) \quad (3)$$
$$= \frac{S\kappa}{H}(Tp \cdot e^{-t/\tau})$$

Specifically, wafer temperature WT after a tiny time Δt (t=Δt) is calculated based on temperature data of heating plate temperature PV at the time t=0 and Equation 1 and the heat quantity QΔt given to wafer W for the tiny time Δt is calculated based on calculated wafer temperature WT and Equation 3. Similarly, further, wafer temperature WT and given heat quantity QΔt after the tiny time Δt (t=2Δt) are obtained. By performing numerical calculation of the Equations repeatedly, wafer temperature WT at steps S11 and S12 and given total heat quantity Q may be obtained.

In order to perform the prediction process (step S15) of the first process to be described below, step S12 may be at least performed and step S11 may be omitted.

In the examples shown in FIGS. 10(a) and 10(b), in a former half of the thermal processing, heating plate temperature PV of first test wafer TW1 is higher than heating plate temperature PV of second test wafer TW2. Therefore, the total heat quantity given to first test wafer TW1 is larger than the total heat quantity given to second test wafer TW2.

Further, even when heating plate temperatures PV corresponding to heaters 171a 171b, and 171c, respectively are different from each other, the heat quantity per unit area given to first test wafer TW1 or second test wafer TW2 is different among positions P1, P2, and P3.

When the heat quantity given among wafers W or in a plane of wafer W is different, a critical dimension CD of a resist pattern formed by performing even a developing processing is different. This is because reaction in which the resist film in an exposure region is solubilized in the developing liquid progresses differently in post-exposure bake, and as a result, the width of a soluble portion removed in the developing processing is different. Herein, the critical dimension CD is measured by using a critical dimension measuring apparatus 140.

FIGS. 13(a) and 13(b) are schematic cross-sectional views of a resist pattern 303 formed by exposing a resist film 302 formed on wafer W with an anti-reflection film 301 interposed therebetween, performing post-exposure bake in accordance with thermal processing conditions corresponding to steps S11 and S12 after the exposure, respectively, and performing the developing processing. FIG. 13(a) shows step S11, that is, a case in which the heat quantity given to wafer W is relatively large and FIG. 13(b) shows step S12, that is, a case in which the heat quantity given to wafer W is relatively small. As the heat quantity given to wafer W increases, a reaction progresses in which resist film 302 in the exposure region is solubilized in the developing liquid to form soluble portion 304, and as a result, the width of soluble portion 304 removed in the developing processing increases. Therefore, the critical dimension CD of formed resist pattern 303 decreases.

FIG. 14 is a graph showing comparison of the critical dimension CD of a resist pattern among positions corresponding to positions P1 to P3 of heat sources. The resist pattern is formed by performing a post-exposure bake under the same thermal processing condition as step S11, after the exposure and developing processing is performed. When the heat quantity per unit area given to wafer W increases in the order of P1, P2, and P3, critical dimension CD of the formed resist pattern decreases in the order of P1, P2, and P3. That is, when the heat quantity per unit area given to wafer W is different in the plane of wafer W, the uniformity in the plane of wafer W of critical dimension CD deteriorates.

As described above, by performing the data obtaining process (step S12) and the calculating process (step S13), the predetermined heat quantity given to wafer W is calculated when the thermal processing is initiated while the temperature of heating plate 170 is maintained to second temperature T2. Thereafter, thermal processing is performed for each of wafers W of a wafer group to be actually processed.

In the initiating process (step S14) of the first process, the set temperature of heating plate 170 is changed from first temperature T1 to second temperature T2, and a first wafer (initial wafer) W1 is placed on heating plate 170 and the thermal processing is initiated at third temperature T3 between first temperature T1 and second temperature T2 before the temperature of heating plate 170 in which the set temperature is changed reaches second temperature T2. In addition, the temperature data of heating plate temperature PV is obtained, which is the temperature of heating plate 170 after thermal processing is initiated.

First wafer W1 corresponds to a first substrate of a substrate group in the exemplary embodiment of the present disclosure.

Specifically, the set temperature of each of heaters 171a to 171c is changed from first temperature T1 to second temperature T2. In addition, before heating plate temperature PV around heaters 171a, 171b, and 171c reaches second temperature T2, first test wafer TW1 is placed on heating plate 170 and thermal processing is initiated at third temperature T3 between first temperature T1 and second temperature T2. Further, a thermal processing is performed for first test wafer TW1 by heating plate 170 in which the set temperature is changed to second temperature T2 and heating plate temperatures PV of heating plate 170 is measured at a plurality of positions P1, P2, and P3 corresponding to heaters 171a, 171b, and 171c, respectively.

Next, in the prediction process (step S15) of the first process, when the temperature of heating plate 170 reaches second temperature T2, the heat quantity given to first wafer W1 by heating plate 170 is predicted in the case where the set temperature of heating plate 170 is not changed from second temperature T2, based on the obtained temperature data of heating plate temperature PV.

In the same manner as the calculating process (step S13), the heat quantity given to first wafer W1 by heating plate 170 is calculated based on the obtained temperature data of heating plate temperature PV. However, the obtained temperature data of heating plate temperature PV is related to only the former half of the thermal processing. Therefore, the heat quantity to be given to first wafer W1 by heating plate 170 after heating plate temperature PV reaches the set temperature is calculated assuming that heating plate temperature PV is thereafter the same as second temperature T2.

When obtaining the temperature data of each of positions P1 to P3 corresponding to heaters 171a to 171c, the heat quantity given to first wafer W1 by heating plate 170 at each of positions P1 to P3 is predicted based on the temperature data of heating plate temperature PV obtained for each of positions P1 to P3.

Next, in the change process (step S16) of the first process, the set temperature of heating plate 170 is changed from second temperature T2 and a thermal processing is performed for first wafer W1 by heating plate 170 in which the set temperature is changed, based on the predicted heat quantity and the heat quantity given to a second wafer W2 by heating plate 170. In this case, the set temperature of heating plate 170 is changed to second temperature T2 based on the predicted heat quantity so that the heat quantity actually given to first wafer W1 by heating plate 170 is the same as the heat quantity given to wafer W calculated in the calculating process (step S13).

For example, the predicted heat quantity is represented by Q1. Further, the heat quantity at step S12 that is previously calculated is represented by Q2. In addition, a time in which the thermal processing is performed by changing the set temperature in the change process (step S16) of the first process is represented by t1 and the weight and specific heat of wafer W are represented by M and Cw, respectively. In this case, a change amount ΔT of the set temperature can be simply calculated by Equation 4.

[Equation 4]

$$\Delta T = \frac{Q2 - Q1}{t1 \cdot M \cdot Cw} \quad (4)$$

Specifically, by adding change amount ΔT to the set temperature, the set temperature is changed to a new set temperature. That is, when second temperature T2 is lower than first temperature T1, heat quantity Q1 is larger than heat quantity Q2 and ΔT has a negative value. Therefore, the set temperature is set to be lower than second temperature T2 by change amount ΔT. Meanwhile, when second temperature T2 is higher than first temperature T1, heat quantity Q1 is smaller than heat quantity Q2 and ΔT has a positive value. Therefore, the set temperature is set to be higher than second temperature T2 by change amount ΔT.

As an example, for example, first temperature T1 may set to 140° C., second temperature T2 to 110° C., third temperature T3 to 117° C., and the thermal processing time to 60 seconds. Further, during the thermal processing time, a time in which the heat quantity given to first wafer W1 is calculated when heating plate temperature PV reaches second temperature T2, may be set to 30 seconds. In addition, the time t1 in which the thermal processing is performed by changing the set temperature from second temperature T2 by change amount ΔT may be set to 30 seconds. A time interval to obtain data may be set to, for example, 1 second.

In this case, predicted heat quantity Q1 is 8983 J, heat quantity Q2 at step S12 is 8774 J, and Q2−Q1 is −209 J. Further, M is set to 120 g and Cw is set to 0.71 J/g·° C. Therefore, ΔT in Equation 4 is −0.08° C. and the set temperature of heating plate 170 in the change process (step S16) of the first process may be set to a value decreased by 0.08° C.

In addition, as shown in FIG. 15, a thermal processing is performed for first wafer W1 by heating plate 170 in which the set temperature is changed from second temperature T2 by change amount ΔT. In addition, after the thermal processing is performed for a predetermined time, first wafer W1 is carried out from heating plate 170.

When the heat quantity given to first waver W1 by heating plate 170 at each of positions P1 to P3 corresponding to heaters 171a to 171c, respectively, is predicted, the set temperature of heating plate 170 may be changed to different change amounts ΔT1, ΔT2, and ΔT3 from second temperature T2, based on the predicted heat quantity and the heat quantity given to second wafer W by each of heaters 171a to 1713c. As a result, the uniformity in the plane of the wafer of the heat quantity given to wafer W in the plane of the wafer can be improved and, therefore, the uniformity of the critical dimension CD of the resist pattern formed after the developing processing in the plane of the wafer can be improved.

Further, instead of steps S15 and S16, the heat quantity given to first wafer W1 by heating plate 170 when the set temperature of heating plate 170 is changed from second temperature by ΔT is predicted based on the obtained temperature data of heating plate temperature PV when the temperature of heating plate 170 reaches second temperature T2, and change amount ΔT of the set temperature may be determined based on the predicted heat quantity and the heat quantity given to a next substrate by heating plate 170. In this case, change amount ΔT of the set temperature is determined based on the predicted heat quantity so that the heat quantity actually given to first wafer W1 by heating plate 170 is the same as the heat quantity given to wafer W calculated in the calculating process (step S13).

Next, in the second process (step S17), by reinstating the set temperature of heating plate 170 to second temperature T2, second wafer (next wafer) W2 is placed on heating plate 170 and a thermal processing is initiated while the temperature of heating plate 170 is maintained to second temperature T2. In addition, a thermal processing is performed for second wafer W2 by heating plate 170. Further, after the thermal processing is performed for a predetermined time, second wafer W2 is carried out from heating plate 170.

Second wafer W2 corresponds to the next substrate of the substrate group in the exemplary embodiment of the present disclosure.

According to the exemplary embodiment of the present disclosure, when the temperature of heating plate 170 is third temperature T3 between first temperature T1 and second temperature T2 before reaching second temperature T2 from first temperature T1, a thermal processing is initiated for first wafer (initial wafer) W1. As a result, the thermal processing for first wafer (initial wafer) W1 may be initiated faster than the case where the thermal processing is initiated after the temperature of heating plate 170 reaches second temperature T2. For example, when first temperature T1, second temperature T2, and third temperature T3 are set to 140° C., 110° C. and 117° C., respectively, the thermal processing of first wafer (initial wafer) W1 may be initiated earlier by approximately 30 seconds.

Further, according to the exemplary embodiment of the present disclosure, the heat quantity given to first wafer (initial wafer) W1 in the first process (steps S14 to S16) and the heat quantity given to second wafer (next wafer) W2 in the second process (step S17) may be substantially the same as each other. Therefore, the reaction in which the resist film is solubilized in the developing liquid in the exposure region may progress substantially in the same manner, and, as a result, the width of the soluble portion removed in the developing processing may be substantially the same. Accordingly, between first wafer (initial wafer) W1 and second wafer (next wafer) W2 (and subsequent wafers W), critical dimension CD of the resist pattern formed through the developing processing may be substantially the same.

For example, when a thermal processing is performed for first wafer W1 by step S11 of the data obtaining process instead of the first process (step S14 and S16), and thereafter, the second process (step S17) is performed, critical dimension CD is 65.37 nm in first wafer W1 and 66.00 nm in second wafer W2. Meanwhile, when a thermal processing is performed for first wafer W1 by the first process (steps S14 to S16) and thereafter, the second process (step S17) is performed, critical dimension CD may be 65.80 nm in first wafer W1 and 66.00 nm in second wafer W2.

Further, according to the exemplary embodiment of the present disclosure, there is no concern that the rigidity of heating plate 170 will deteriorate as the thickness of heating plate 170 becomes thinner in order to decrease the heat capacity. Further, since the cooling mechanism cooling heating plate 170 is not necessary, there is no concern of increasing the apparatus cost.

Meanwhile, in the thermal processing method according to the exemplary embodiment of the present disclosure, the thermal processing time of the latter half of the thermal processing that is initiated before the set temperature is reached may be changed so that the heat quantity given to the wafer when the thermal processing is initiated prior to reaching the set temperature is the same as the predetermined heat quantity given to the wafer when the thermal processing is initiated after the set temperature is reached. Hereinafter, referring to FIGS. 16 to 17, a thermal processing method according to a modified example of the exemplary embodiment of the present disclosure will be described.

Figure 16:
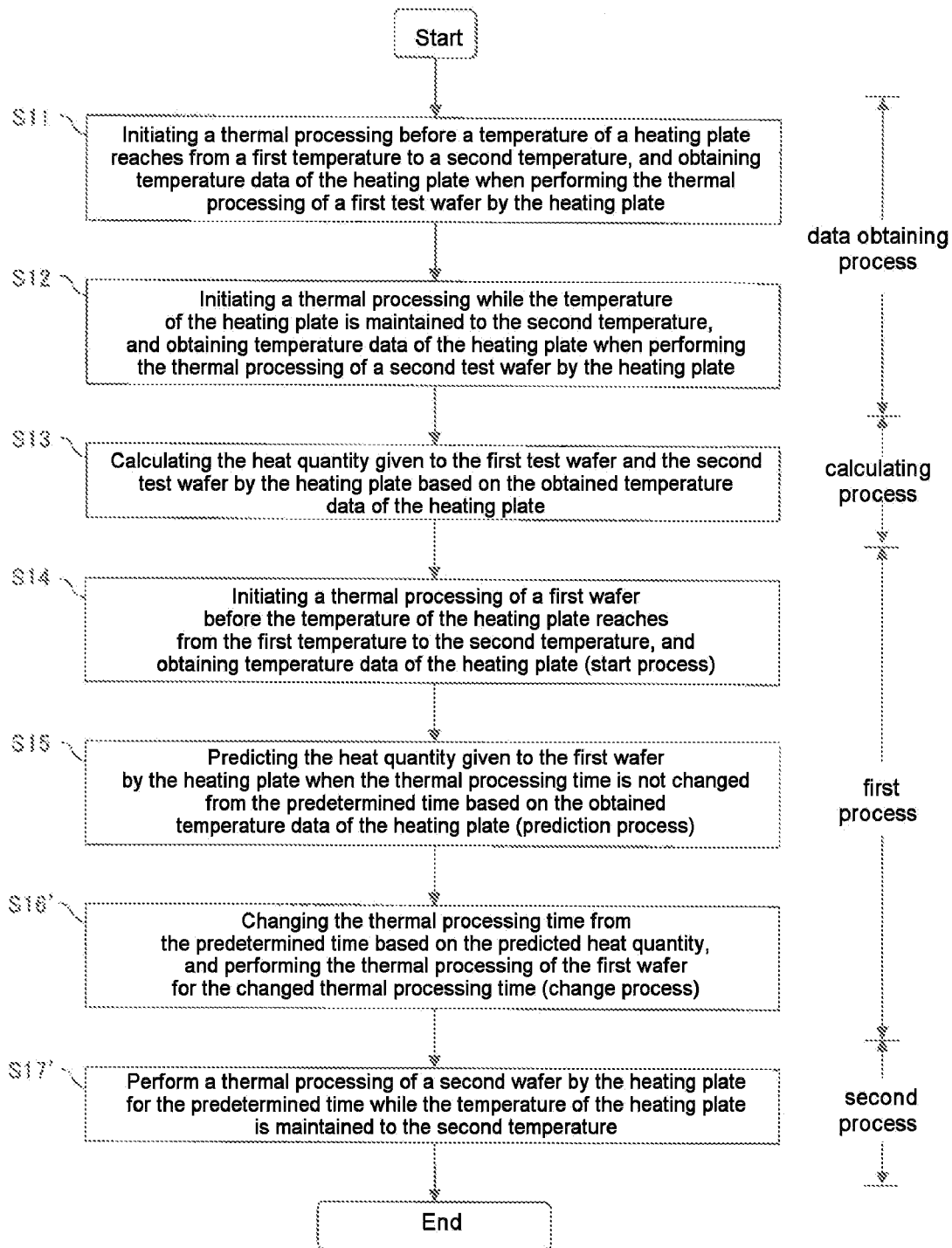
FIG. 16 is a flowchart for explaining the sequence of each process in a thermal processing method according to a modified example of an exemplary embodiment of the present disclosure.
Figure 17:
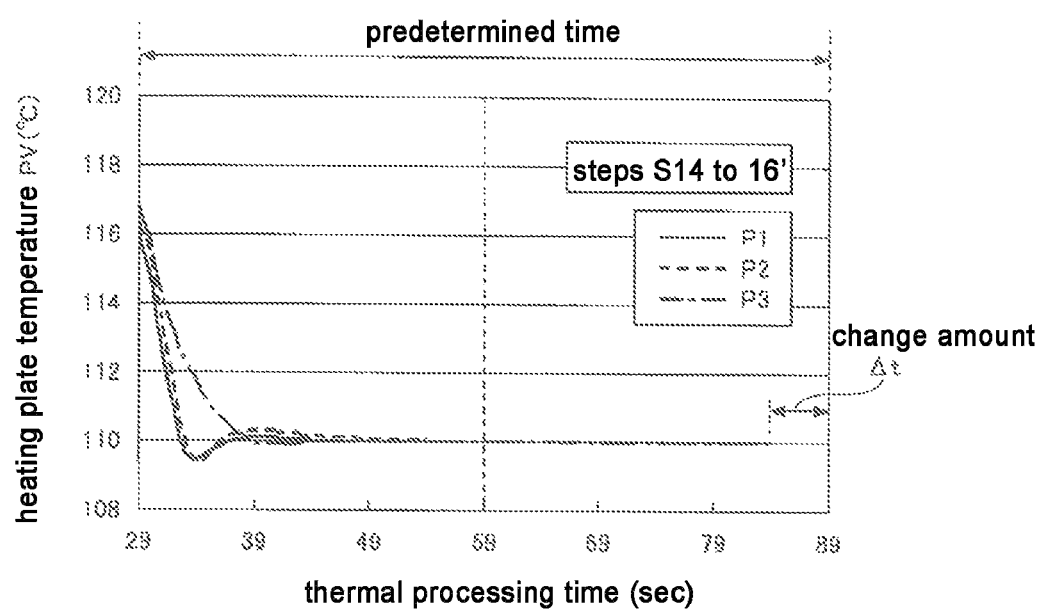
FIG. 17 is a graph showing a change in the temperature of a heating plate over a time period in a first process.

FIG. 16 is a flowchart for describing the sequence of each process in a thermal processing method according to a modified example. FIG. 17 is a graph showing a temporal change of the temperature of a heating plate PV in a first process.

As shown in FIG. 16, the thermal processing method according to the modified example includes a data obtaining process (steps S11 and S12), a calculating process (step S13), a first process (steps S14 to S16'), and a second process (step S17'). At steps S11 to S15, the thermal processing method is the same as the thermal processing method according to the exemplary embodiment described above with FIG. 9. However, at the prediction process (step S15), the heat quantity given to first wafer W1 by heating plate 170 is predicted when the thermal processing time is not changed from the predetermined time on the basis of the obtained temperature data of heating plate temperature PV.

Next, at the modified process (step S16') of the first process, the thermal processing time is changed from the predetermined time and a thermal processing is performed for first wafer W1 for the changed thermal processing time based on the predicted heat quantity and the heat quantity given to second wafer W2 by heating plate 170. In this case, the thermal processing time is changed from the predetermined time based on the predicted heat quantity and a thermal processing is performed for first wafer W1 for the changed thermal processing time so that the heat quantity actually given to first wafer W1 by heating plate 170 is the same as the heat quantity given to wafer W calculated in the calculating process (step S13).

For example, the predicted heat quantity is represented by Q1. Further, the heat quantity at step S12 that is previously calculated is represented by Q2. In addition, a changed time in which the thermal processing time is changed from the predetermined time is represented by t1 and the weight and specific heat of wafer W are represented by M and Cw, respectively. In this case, a change amount Δt of the thermal processing time can be simply calculated by Equation 5.

[Equation 5]

$$\Delta t = \frac{Q2 - Q1}{M \cdot Cw \cdot (T2 + 273.15)} \quad (5)$$

Specifically, by adding change amount Δt to the predetermined time, the thermal processing time is changed to a new thermal processing time. That is, when second temperature T2 is lower than first temperature T1, heat quantity Q1 is larger than heat quantity Q2 and Δt has a negative value. Therefore, the thermal processing time is shorter than the predetermined time by change amount Δt. Meanwhile, when second temperature T2 is higher than first temperature T1, heat quantity Q1 is smaller than heat quantity Q2 and Δt has a positive value. Therefore, the thermal processing time is longer than the predetermined time by change amount Δt.

In addition, as shown in FIG. 17, a thermal processing is performed for first wafer W1 by heating plate 170 for the thermal processing time changed from the predetermined time by change amount Δt. In addition, after the thermal processing is performed, first wafer W1 is carried out from heating plate 170.

Next, at the second process (step S17'), after reinstating the thermal processing time to the predetermined time, second wafer W2 is placed on heating plate 170 and a thermal processing is initiated while the temperature of heating plate 170 is maintained to second temperature T2. Thereafter, a thermal processing is performed for second wafer W2 by heating plate 170. Further, after the thermal processing is performed for the predetermined time, second wafer W2 is carried out from heating plate 170.

Even in the modified example, when the temperature of heating plate 170 is third temperature T3 between first temperature T1 and second temperature T2 before reaching second temperature T2 from first temperature T1, a thermal processing is initiated for first wafer (initial wafer) W1. As a result, the thermal processing for first wafer (initial wafer) W1 may be initiated faster than the case in which the thermal processing is initiated after the temperature of heating plate 170 reaches second temperature T2.

For example, when first temperature T1, second temperature T2, and third temperature T3 are set to 140° C., 110° C. and 117° C., respectively, the thermal processing of first wafer (initial wafer) W1 may be initiated earlier by approximately 30 seconds.

Further, even in the modified example, the heat quantity given to first wafer (initial wafer) W1 in the first process (steps S14 to S16') and the heat quantity given to second wafer (subsequent wafer) W2 in the second process (step S17') may be substantially the same as each other. Therefore, the reaction in which the resist film is solubilized in the developing liquid in the exposure region may progress substantially in the same manner, and, as a result, the width of the soluble portion removed in the developing processing may be substantially the same. Thereafter, critical dimension CD of the resist pattern formed through the developing processing may be substantially the same between first wafer (initial wafer) W1 and second wafer (next wafer) W2 (and subsequent wafers W).

Further, even in the modified example, there is no concern that the rigidity of heating plate 170 will deteriorate as the thickness of heating plate 170 becomes thinner in order to decrease the heat capacity. Further, since the cooling mechanism cooling heating plate 170 is not necessary, there is no concern of increasing the apparatus cost.

As described above, although the exemplary embodiments of the present disclosure have been described, the present disclosure is not limited to the specific exemplary embodiments, but various modifications and changes can be made without departing from the scope and spirits included in the appended claims.

The present disclosure may be applied to various thermal processing apparatuses in addition to the post-exposing apparatus. Further, the present disclosure may be applied to apparatuses for performing the thermal processing of a semiconductor substrate, a glass substrate, and various other substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A thermal processing method in which each of a plurality of substrates of a substrate group is sequentially disposed and processed on a heating plate set to a predetermined temperature, the method comprising:
changing a set temperature of the heating plate from a first temperature which is a starting temperature of the heating plate to a second temperature;
initiating a thermal processing for a first substrate of the substrate group before the temperature of the heating plate reaches the second temperature;
obtaining temperature data of the heating plate after the thermal processing is initiated for the first substrate;
when the set temperature of the heating plate reaches the second temperature, calculating a heat quantity liven to the first substrate by the heating plate based on the obtained temperature data of the heating plate;
changing the set temperature of the heating plate from the second temperature to a third temperature based on the heat quantity given to the first substrate by the heating plate obtained at the calculating such that the heat quantity given to the first substrate by the heating plate becomes the same as a heat quantity determined in advance for a case where a thermal processing is initiated after the temperature of the heating plate reaches the second temperature; and
thermal processing of the first substrate using the heating plate for which the set temperature has been changed;
reinstating the temperature of the heating plate from the third temperature to the second temperature after the thermal processing of the first substrate is completed; and
thermal processing of a next substrate of the substrate group using the heating plate while the temperature of the heating plate is maintained at the second temperature.

2. The method of claim 1, further comprising:
predicting the heat quantity given to the first substrate by the heating plate when the set temperature of the heating plate is not changed from the second temperature on the basis of the obtained temperature data of the heating plate; and
changing the set temperature of the heating plate based on the predicted heat quantity and the heat quantity given to the next substrate by the heating plate.

3. The method of claim 2, wherein the heating plate has a plurality of heat sources provided in a concentric shape, and the first process changes a set temperature of each of the heat sources from a first temperature to a second temperature, initiates the thermal processing for the first substrate of the substrate group before the temperature of each of the heat source reaches the second temperature, obtains temperature data of each of the heat source after the thermal processing is initiated, predicts the heat quantity given to the first substrate by each of the heat source when the set temperature of each of the heat source is not changed from the second temperature on the basis of the obtained temperature data of each of the heat source, and changes the set temperature of each of the heat source based on the predicted heat quantity and the heat quantity given to the next substrate by each of the heat source.

4. The method of claim 2, wherein a thermal processing of a test substrate is initiated in advance while the temperature of the heating plate is maintained to the second temperature, the temperature data of the heating plate is obtained while the test substrate is being processed, and the heat quantity given to the next substrate is calculated based on the obtained temperature data of the heating plate.

5. A non-transitory computer-readable recording medium recording a program for executing the thermal processing method according to claim 1.

6. A thermal processing method in which each of a plurality of substrates of a substrate group is sequentially disposed and processed for a predetermined of time on a heating plate set to a predetermined temperature, the method comprising:
- changing a set temperature of the heating plate from a first temperature which is a starting temperature of the heating plate to a second temperature;
- initiating a thermal processing for a first substrate of the substrate group before the temperature of the heating plate reaches the second temperature;
- obtaining temperature data of the heating plate after the thermal processing is initiated for the first substrate;
- when the set temperature of the heating plate reaches the second temperature, calculating a heat quantity given to the first substrate by the heating plate based on the obtained temperature data of the heating plate;
- changing a processing time of the first substrate from the predetermined time to an adjusted processing time based on the heat quantity given to the first substrate by the heating plate obtained at the calculating such that the heat quantity given to the first substrate by the heating plate becomes the same as a heat quantity determined in advance for a case where a thermal processing is initiated after the temperature of the heating plate reaches the second temperature; and
- thermal processing of the first substrate using the heating plate for the changed processing time, and
- reinstating the adjusted processing time to the predetermined time after the thermal processing of the first substrate is completed; and
- thermal processing of a next substrate of the substrate group for the predetermined time using the heating plate while the temperature of the heating plate is maintained at the second temperature.

7. The method of claim 6, further comprising:
- predicting the heat quantity given to the first substrate by the heating plate when the processing time of the first substrate is not changed from predetermined time on the basis of the obtained temperature data of the heating plate; and
- changing the processing time based on the predicted heat quantity and the heat quantity given to the next substrate by the heating plate.

8. A thermal processing apparatus comprising:
- a heating plate equipped with a heater and a temperature sensor, and configured to be heated with a predetermined temperature and dispose each of substrates of a substrate group including a plurality of substrates thereby sequentially performing a thermal processing for the plurality of substrates; and
- a controller configured to control an overall operation of the thermal processing system including the heater and the temperature sensor,
- wherein the controller is configured to:
  - change a set temperature of the heating plate from a first temperature which is a starting temperature of the heating plate to a second temperature;
  - initiate a thermal processing for a first substrate of the substrate group before the temperature of the heating plate reaches the second temperature;
  - obtain temperature data of the heating plate after the thermal processing is initiated for the first substrate;
  - when the set temperature of the heating plate reaches the second temperature, calculate a heat quantity given to the first substrate by the heating plate based on the obtained temperature data of the heating plate;
  - change the set temperature of the heating plate from the second temperature to a third temperature based on the heat quantity given to the first substrate by the heating plate such that the heat quantity given to the first substrate by the heating plate becomes the same as a heat quantity determined in advance for a case where a thermal processing is initiated after the temperature of the heating plate reaches the second temperature;
  - thermal process the first substrate using the heating plate for which the set temperature has been changed;
  - reinstate the temperature of the heating plate from the third temperature to the second temperature after the thermal processing of the first substrate is completed; and
  - thermal process a next substrate of the substrate group using the heating plate while the temperature of the heating plate is maintained at the second temperature.

9. The apparatus of claim 8, wherein the controller is configured to predict the heat quantity given to the first substrate by the heating plate when the set temperature of the heating plate is not changed from the second temperature based on the obtained temperature data of the heating plate, and change the set temperature of the heating plate based on the predicted heat quantity and the heat quantity given to the next substrate by the heating plate.

10. The apparatus of claim 9, wherein:
- the heating plate has a plurality of heating sources provided in a concentric shape, and
- the controller is configured to change a set temperature of each of the heating sources from the first temperature to the second temperature, initiate a thermal processing for a first substrate of the substrate group before the temperature of each of the heating sources reaches the second temperature; obtains temperature data of each of the heating sources after the thermal processing is initiated; changes the set temperature of each of the heating sources from the second temperature when the set temperature reaches the second temperature based on the obtained temperature data of each of the heating sources; thermal process of the first substrate using each of the heating sources for which the set temperature has been changed; reinstate the temperature of each of the heating sources to the second temperature after the thermal processing of the first substrate; and thermal process of a next substrate of the substrate group using each of the heating sources while the temperature of each of the heating sources is maintained at the second temperature.

11. The apparatus of claim 9, wherein the thermal processing of a test substrate is initiated in advance while the temperature of the heating plate is maintained to the second temperature, the temperature data of the heating plate is obtained while the test substrate is being processed, and the heat quantity given to the next substrate is calculated based on the obtained temperature data of the heating plate.

12. A thermal processing apparatus comprising:
- a heating plate equipped with a heater and a temperature sensor, and configured to be heated with a predetermined temperature and dispose each of substrates of a substrate group including a plurality of substrates thereby sequentially performing a thermal processing for the plurality of substrates for a predetermined of time; and
- a controller configured to control an overall operation of the thermal processing system including the heater and the temperature sensor,
- wherein the controller is configured to:
  - change a set temperature of the heating plate from a first temperature which is a starting temperature of the heating plate to a second temperature;

initiate a thermal processing for a first substrate of the substrate group before the temperature of the heating plate reaches the second temperature;

obtain temperature data of the heating plate after the thermal processing is initiated for the first substrate;

when the set temperature of the heating plate reaches the second temperature, calculate a heat quantity given to the first substrate by the heating slate based on the obtained temperature data of the heating plate;

change a processing time of the first substrate from the predetermined time to an adjusted processing time based on the heat quantity given to the first substrate by the heating late such that the heat quantity given to the first substrate by the heating plate becomes the same as a heat quantity determined in advance for a case where a thermal processing is initiated after the temperature of the heating plate reaches the second temperature;

thermal process the first substrate using the heating plate for the changed processing time;

reinstate the adjusted processing time to the predetermined time after the thermal processing of the first substrate is completed; and thermal process of a next substrate of the substrate group for the predetermined time using the heating plate while the temperature of the heating plate is maintained at the second temperature.

13. The apparatus of claim 12, wherein the controller is configured to predict the heat quantity given to the initial substrate by the heating plate when the thermal processing time of the first substrate is not changed from the predetermined time based on the obtained temperature data of the heating plate and changes the thermal processing time based on the predicted heat quantity and the heat quantity given to the next substrate by the heating plate.

* * * * *